US012689012B2

(12) United States Patent
Inagaki

(10) Patent No.: US 12,689,012 B2
(45) Date of Patent: Jul. 21, 2026

(54) IGNITION CONDITION CALCULATION METHOD AND PLASMA PROCESSING APPARATUS

(71) Applicant: Tokyo Electron Limited, Tokyo (JP)

(72) Inventor: Morihito Inagaki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 90 days.

(21) Appl. No.: 18/924,053

(22) Filed: Oct. 23, 2024

(65) Prior Publication Data

US 2025/0140539 A1      May 1, 2025

(30) Foreign Application Priority Data

Nov. 1, 2023      (JP) ................................. 2023-187820

(51) Int. Cl.
 *G08B 21/00*      (2006.01)
 *G08B 21/18*      (2006.01)
 *H01J 37/32*      (2006.01)

(52) U.S. Cl.
 CPC ........ *H01J 37/32926* (2013.01); *G08B 21/18* (2013.01)

(58) Field of Classification Search
 CPC ........... H01J 37/32926; H01J 37/32183; H01J 37/32935; G08B 21/18
 See application file for complete search history.

(56) References Cited

U.S. PATENT DOCUMENTS

| | | | | |
|---|---|---|---|---|
| 8,256,278 B2 * | 9/2012 | Lee | ........................ | G01M 15/11 |
| | | | | 73/114.04 |
| 9,243,573 B2 * | 1/2016 | Glugla | .................. | F01N 11/002 |
| 9,272,706 B2 * | 3/2016 | Martin | .................. | B60W 20/50 |
| 9,951,703 B2 * | 4/2018 | Pathan | .................... | B61C 17/00 |
| 2017/0058856 A1 * | 3/2017 | Masuda | .................... | F02P 3/04 |

FOREIGN PATENT DOCUMENTS

JP          2023-108313 A      8/2023

* cited by examiner

*Primary Examiner* — Toan N Pham
(74) *Attorney, Agent, or Firm* — Venjuris, P.C.

(57) ABSTRACT

An ignition condition calculation method includes (A) searching for ignition condition information including first plasma state information when a plasma is ignited under a preset ignition condition, and storing the ignition condition information in a storage; (B) searching for misfire condition information including second plasma state information when the plasma misfires after the plasma has been ignited, and storing the misfire condition information in the storage; and (C) displaying the ignition condition information and the misfire condition information on a display.

11 Claims, 15 Drawing Sheets

FIG. 6

| IGNITION | PRESSURE (Torr) | | | | | |
|---|---|---|---|---|---|---|
| | ... | 1.78 (−0.02) | 1.79 (−0.01) | 1.80 (REFERENCE) | 1.81 (+0.01) | 1.82 (+0.02) | ... |
| Vpp | | − | V12 | V11 | V13 | − | |
| RF REFLECTED WAVE (POWER) | | − | Pr12 | Pr11 | Pr13 | − | |

FIG. 7

| MISFIRE | | PRESSURE (Torr) | | | | | | | | | |
|---|---|---|---|---|---|---|---|---|---|---|---|
| | | 1.60 | 1.61 | 1.62 | 1.63 | | 2.36 | 2.37 | 2.38 | 2.39 | 2.40 |
| Vpp | UPPER LIMIT VALUE | | | | | | | | | | V15 |
| | LOWER LIMIT VALUE | V14 | | | | | | | | | |
| RF REFLECTED WAVE (POWER) | UPPER LIMIT VALUE | | | | | | | | | | Pr15 |
| | LOWER LIMIT VALUE | Pr14 | | | | | | | | | |

FIG. 10

| RECIPE A | STEP1 | STEP2 | STEP3 | ··· |
|---|---|---|---|---|
| END TIME | T1 | T2 | T3 | ··· |
| PRESSURE | P1 | P2 | P3 | ··· |
| VOLTAGE (POWER) | V1 | V2 | V3 | ··· |
| FIRST GAS | G11 | G12 | G13 | ··· |
| SECOND GAS | G21 | G22 | G23 | ··· |
| THIRD GAS | G31 | G32 | G33 | ··· |
| ANTENNA POSITION | H1 | H2 | H3 | ··· |
| IGNITION TABLE | TABLE 1 | TABLE 2 | TABLE 3 | ··· |
|  | ··· | ··· | ··· | ··· |

502 — RECIPE A
503 — END TIME
504 — PRESSURE
505 — VOLTAGE (POWER)
506 — FIRST GAS
507 — SECOND GAS
508 — THIRD GAS
509 — ANTENNA POSITION
510 — IGNITION TABLE

501

| OPTIMUM CONDITION ACQUISITION | RECIPE DISPLAY | RECIPE CONDITION DISPLAY |
|---|---|---|

| ANTENNA POSITION | IGNITION | VOLTAGE (V) | | | | | | |
|---|---|---|---|---|---|---|---|---|
| | | . . . | 298 (~2) | 299 (~1) | 300 (REFERENCE) | 301 (+1) | 302 (+2) | . . . |
| 1 | Vpp | | − | 70 | 74 | 78 | − | |
| | RF REFLECTED WAVE (POWER) | | − | Pr22 | Pr21 | Pr23 | − | |

FIG. 17

| ANTENNA POSITION | MISFIRE | | VOLTAGE (V) | | | | | | | | | |
|---|---|---|---|---|---|---|---|---|---|---|---|---|
| | | | 300 | 1000 | 1500 | 2000 | 2500 | 3000 | 3500 | 4000 | 4500 | 5000 |
| 1 | | UPPER LIMIT VALUE | 100 | | | | | | | | | |
| | | LOWER LIMIT VALUE | 50 | | | | | | | | | |
| 2 | | UPPER LIMIT VALUE | 110 | | | | | | | | | |
| | | LOWER LIMIT VALUE | 60 | | | | | | | | | |
| 3 | | UPPER LIMIT VALUE | 120 | | | | | | | | | |
| | | LOWER LIMIT VALUE | 70 | | | | | | | | | |
| 4 | | UPPER LIMIT VALUE | 130 | | | | | | | | | |
| | Vpp | LOWER LIMIT VALUE | 80 | | | | | | | | | |
| 5 | | UPPER LIMIT VALUE | 140 | | | | | | | | | |
| | | LOWER LIMIT VALUE | 90 | | | | | | | | | |
| 6 | | UPPER LIMIT VALUE | 150 | | | | | | | | | |
| | | LOWER LIMIT VALUE | 100 | | | | | | | | | |
| 7 | | UPPER LIMIT VALUE | 160 | | | | | | | | | |
| | | LOWER LIMIT VALUE | 110 | | | | | | | | | |

IGNITION CONDITION CALCULATION METHOD AND PLASMA PROCESSING APPARATUS

CROSS-REFERENCE TO RELATED APPLICATIONS

This application is based on and claims priority from Japanese Patent Application No. 2023-187820 filed on Nov. 1, 2023 with the Japan Patent Office, the disclosure of which is incorporated herein in its entirety by reference.

TECHNICAL FIELD

The present disclosure relates to an ignition condition calculation method and a plasma processing apparatus.

BACKGROUND

Japanese Patent Laid-Open Publication No. 2023-108313 discloses an ignition control method including measuring first information representing a voltage between electrodes for each of a plurality of adjustment positions of a variable capacitor when a radio-frequency (RF) voltage is applied to the electrodes from an RF power supply for each process type, determining a preset value of the variable capacitor based on the measured first information, and setting an initial position of the adjustment position of the variable capacitor as the determined preset value.

SUMMARY

According to an aspect of the present disclosure, an ignition condition calculation method includes (A) searching for ignition condition information including first plasma state information when a plasma is ignited under a preset ignition condition, and storing the ignition condition information in a storage; (B) searching for misfire condition information including second plasma state information when the plasma misfires after the plasma has been ignited, and storing the misfire condition information in the storage; and (C) displaying the ignition condition information and the misfire condition information on a display.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a diagram illustrating an ignition condition table.

FIG. 7 is a diagram illustrating a misfire condition table.

FIG. 10 is a diagram illustrating a recipe.

FIG. 16 is a diagram illustrating an ignition condition table.

FIG. 17 is a diagram illustrating a misfire condition table.

DETAILED DESCRIPTION

Figure 1:
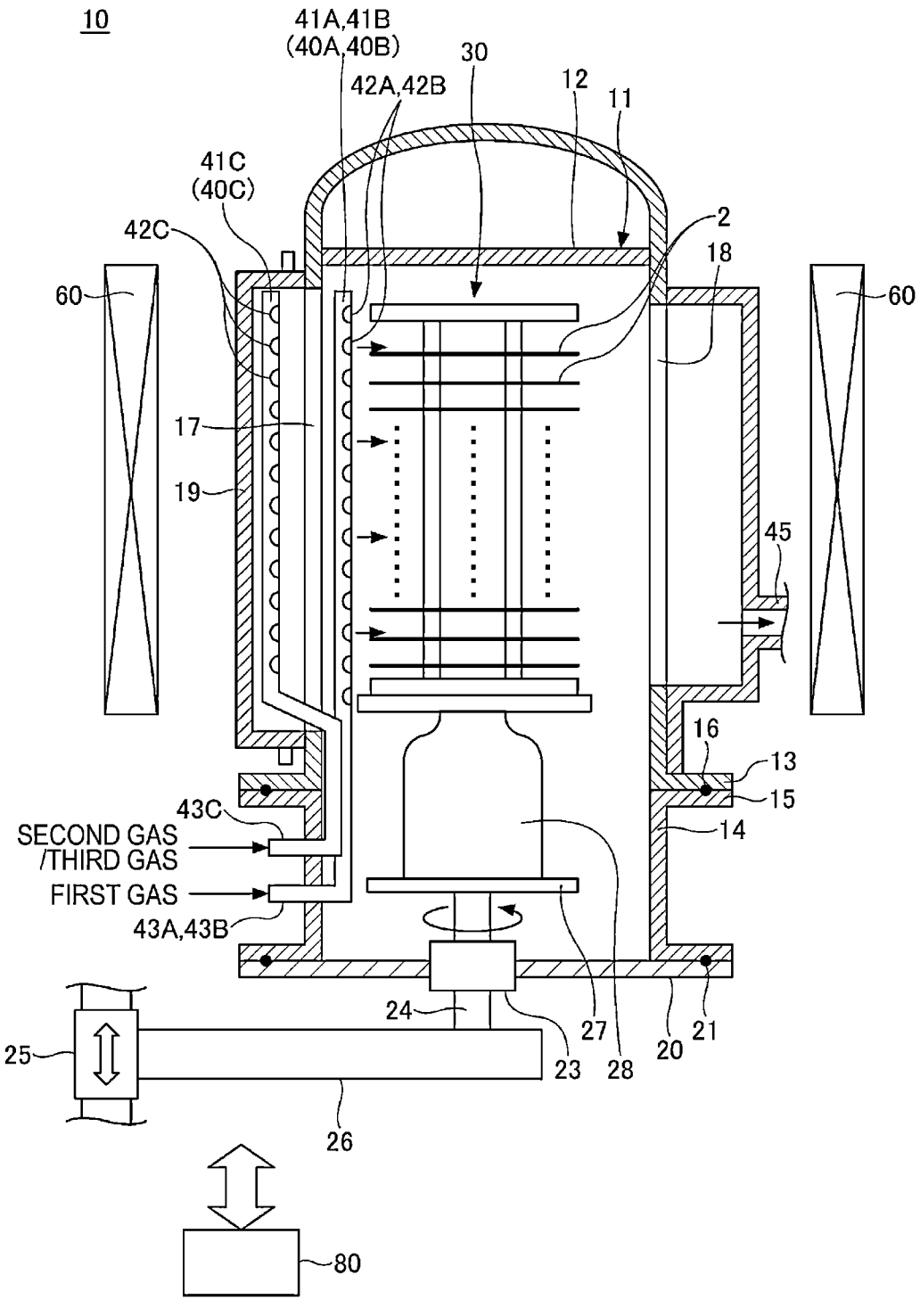
FIG. 1 is a schematic longitudinal cross-sectional view illustrating a plasma processing apparatus according to a first embodiment of the present disclosure.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings. In the respective drawings, the same components may be denoted by the same reference numerals, and overlapping descriptions thereof may be omitted.

[Ignition Conditions]

In film forming using a plasma, the high-precision control of a film quality and thickness has been required, and various gases are being used to generate a plasma, from a plasma processing using a single gas to a plasma processing using a plurality of gases.

A minimum ignition voltage of each gas varies depending on the gas and pressure used, as known from the Paschen's curve. Thus, it is required to minimize the reflected waves (hereinafter, also referred to as RF reflected waves) of RF (radio-frequency) power supplied to each gas, and to stably ignite the plasma.

Conventionally, optimum conditions for ignition were sought by setting process conditions such as a gas type, a gas flow rate, pressure, RF (radio-frequency) voltage or RF power, and an antenna position, and checking a state of a plasma visually or by a power value of RF reflected waves. In other words, conventionally, it was necessary to repeatedly perform a preliminary process before an actual process and find a gas type, a gas flow rate, a pressure, a RF voltage, and an antenna position under plasma ignition conditions or plasma misfire conditions.

According to an ignition condition calculation method according to each of the following embodiments, by inputting a preset ignition condition as a reference, at least one point of optimum plasma ignition conditions may be automatically calculated according to the Paschen's law, and plasma misfire conditions may be automatically calculated.

The input data of the plasma ignition conditions used in the ignition condition calculation method according to each embodiment may include information on the gas type, the gas flow rate, and pressure or RF voltage, and may include information on the antenna position. The output data of the plasma ignition condition may include information on at least one of a peak-to-peak radio-frequency voltage (hereinafter, also referred to as "Vpp") when radio-frequency power is supplied from a RF power supply, power of the RF reflected wave relative to the supplied radio-frequency power, and a pressure (when the input data includes a RF voltage) or RF voltage (when the input data includes a pressure).

First Embodiment

First, a plasma processing apparatus that executes an ignition condition calculation method according to the first embodiment will be described.

[Plasma Processing Apparatus]

Figure 2:
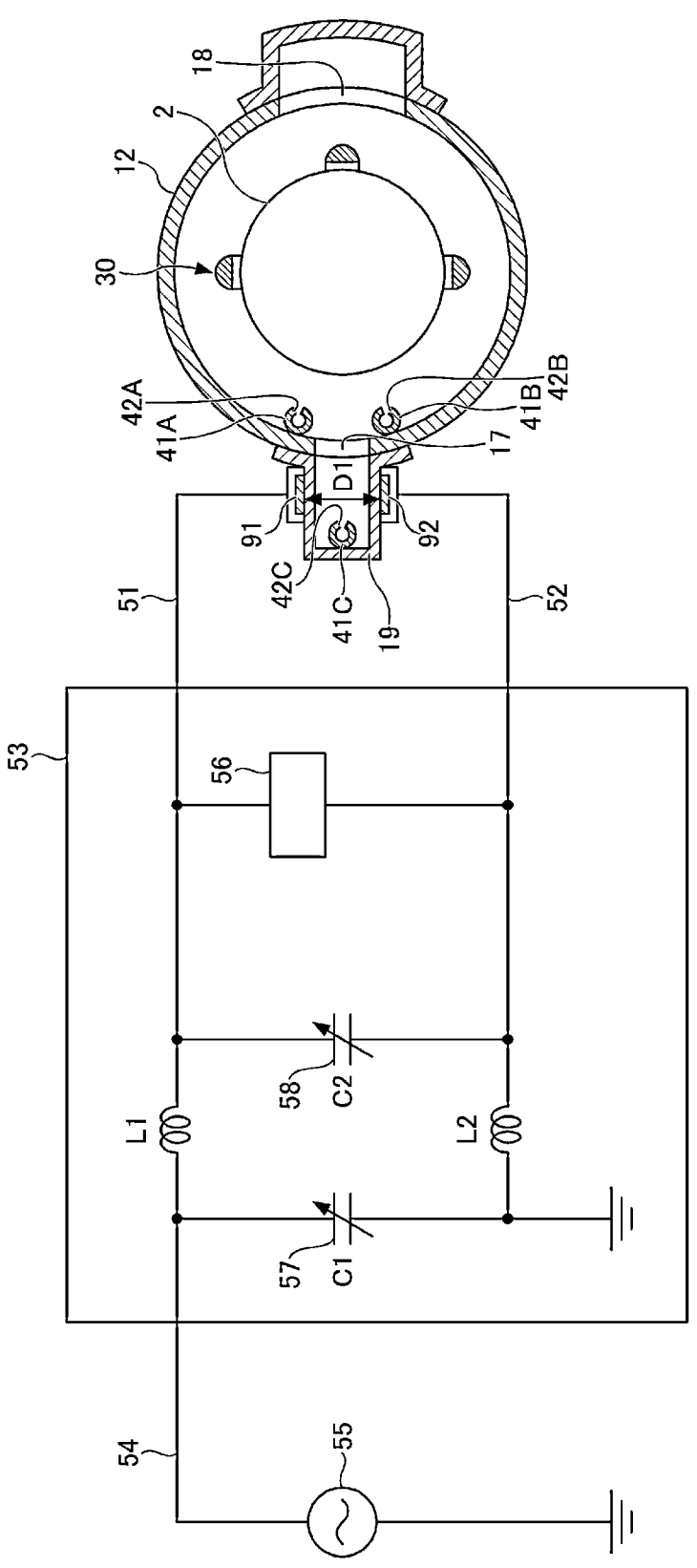
FIG. 2 is a diagram illustrating a configuration of applying a radio-frequency voltage to an electrode from a radio-frequency power supply and a matching unit.

A plasma processing apparatus 10 according to the first embodiment will be described with reference to FIGS. 1 and 2. FIG. 1 is a schematic longitudinal cross-sectional view illustrating the plasma processing apparatus 10 according to the first embodiment. FIG. 2 is a diagram illustrating a configuration of applying a radio-frequency voltage to an electrode from a radio frequency power supply and a matching unit. The plasma processing apparatus 10 is a batch-type vertical heat treatment apparatus that processes a plurality of wafers. The plasma processing apparatus 10 accommodates the plurality of wafers in a processing container (vacuum container) 11, and forms a predetermined film on the plurality of wafers by an atomic layer deposition (ALD) method or chemical vapor deposition (CVD) method.

However, the plasma processing apparatus 10 is not limited to the heat treatment apparatus. For example, the plasma processing apparatus 10 may be a single-wafer processing apparatus that processes wafers one by one. The plasma processing apparatus 10 may also be a semi-batch type apparatus as illustrated in a second embodiment of the present disclosure.

The plasma processing apparatus 10 includes a processing container 11 that accommodates the wafers 2 and has a space formed therein, where the wafers 2 are processed, a cover member 20 that hermetically blocks an opening in a bottom of the processing container 11, and a substrate holder 30 that holds the wafers 2. The wafer 2 is, for example, a semiconductor substrate, more specifically, a silicon wafer. The substrate holder 30 is also called a wafer boat.

The processing container 11 has a cylindrical body 12 of the processing container, which has an open lower end and a ceiling. The body 12 of the processing container is formed, for example, of quartz. A flange portion 13 is formed at the lower end of the body 12 of the processing container. Also, the processing container 11 has a manifold 14, for example, in a cylindrical shape. The manifold 14 is formed, for example, of stainless steel. A flange portion 15 is formed at an upper end of the manifold 14, and the flange portion 13 of the body 12 of the processing container is installed on the flange portion 15. A sealing member 16 such as an O-ring is disposed between the flange portion 15 and the flange portion 13.

The cover member 20 is hermetically attached to the opening at a lower end of the manifold 14 through a sealing member 21 such as an O-ring. The cover member 20 is made of, for example, stainless steel. In a central portion of the cover member 20, a through-hole is formed to penetrate the cover member 20 in a vertical direction. A rotating shaft 24 is disposed in the through-hole. A gap between the cover member 20 and the rotating shaft 24 is sealed by a magnetic fluid sealing portion 23. A lower end of the rotating shaft 24 is rotatably supported by an arm 26 of a lifting and lowering unit 25. A rotating plate 27 is installed on an upper end of the rotating shaft 24. On the rotating plate 27, the substrate holder 30 is installed through a heat insulation stand 28.

The substrate holder 30 holds the plurality of wafers 2 at intervals in the vertical direction. Each of the plurality of wafers 2 is held horizontally. The substrate holder 30 is made of, for example, quartz ($SiO_2$) or silicon carbide (SiC). When the lifting and lowering unit 25 is raised, the cover member 20 and the substrate holder 30 are raised, the substrate holder 30 is carried into an inside of the processing container 11, and the opening at the lower end of the processing container 11 is sealed with the cover member 20. When the lifting and lowering unit 25 is lowered, the cover member 20 and the substrate holder 30 are lowered, and substrate holder 30 is carried out to the outside of the processing container 11. In addition, when the rotating shaft 24 is rotated, the substrate holder 30 rotates together with the rotating plate 27.

The plasma processing apparatus 10 includes three gas supply pipes 40A, 40B, and 40C. The gas supply pipes 40A, 40B, and 40C are made of, for example, quartz ($SiO_2$). The gas supply pipes 40A, 40B, and 40C supply a first gas to a third gas to the inside of the processing container 11. A single gas supply pipe may sequentially eject one type or multiple types of gas. Also, a plurality of gas supply pipes may eject the same type of gas.

The gas supply pipes 40A, 40B, and 40C include horizontal pipes 43A, 43B, and 43C that penetrate the manifold 14 horizontally, and vertical pipes 41A, 41B, and 41C that are disposed vertically inside the processing container 11. The vertical pipes 41A, 41B, and 41C include a plurality of air inlets 42A, 42B, and 42C spaced apart in the vertical direction. A gas supplied to the horizontal pipes 43A, 43B, and 43C is sent to the vertical pipes 41A, 41B, and 41C and is ejected horizontally from the plurality of air inlets 42A, 42B, and 42C. The vertical pipe 41C is disposed within a plasma box 19. The vertical pipes 41A and 41B are disposed within the processing container 11.

The plasma processing apparatus 10 includes an exhaust pipe 45. The exhaust pipe 45 is connected to an exhaust device (not illustrated). The exhaust device includes a vacuum pump and evacuates the inside of the processing container 11. An exhaust port 18 is formed in the body 12 of the processing container 11. The exhaust port 18 is disposed to face the air inlets 42A, 42B, and 42C. The gas ejected horizontally from the air inlets 42A, 42B, and 42C passes through the exhaust port 18 and is then exhausted from the exhaust pipe 45. The exhaust device absorbs a gas inside the processing container 11 and sends the gas to a removal device. The removal device removes harmful components of the exhaust gas and then releases the exhaust gas into the atmosphere.

The plasma processing apparatus 10 also includes a heating unit 60. The heating unit 60 is disposed in an outside of the processing container 11 and heats the inside of the processing container 11 from the outside of the processing container 11. For example, the heating unit 60 is formed in a cylindrical shape to surround the body 12 of the processing container. The heating unit 60 is formed of, for example, an electric heater. The heating unit 60 heats the inside of the processing container 11, thereby improving processing capability of a gas that is supplied into the processing container 11.

As illustrated in FIGS. 1 and 2, an opening 17 is formed in a portion of the body 12 of the processing container in a circumferential direction. The plasma box 19 is formed on a side surface of the processing container 11 to surround the opening 17. The plasma box 19 is formed to protrude outward in a diameter direction from the body 12 of the processing container, and is formed, for example, in an approximately U-shape when viewed in the vertical direction.

A pair of electrodes 91 and 92 are disposed to have the plasma box 19 interposed therebetween. The electrodes 91 and 92 are a pair of parallel electrodes installed on an outside of the plasma box 19 to face each other. The electrodes 91 and 92 are disposed to face each other and formed to be thin and elongated in the vertical direction with a distance D1 between the electrodes 91 and 92. The electrodes 91 and 92 are connected to an RF power supply 55 through a matching unit 53, and an RF voltage (RF power) is applied (supplied) from the RF power supply 55.

The matching unit 53 is connected in series between the RF power supply 55 and the electrodes 91 and 92 through voltage supply lines 51, 52, and 54. The matching unit 53 includes a first variable capacitor 57 (capacitive element C1), a second variable capacitor 58 (capacitive element C2), and coils L1 and L2.

When RF power is supplied from the RF power supply 55 to a load side (a side of the plasma box 19), the matching unit 53 performs matching of an impedance between the RF power supply 55 and the load and suppresses the RF power of the reflected wave (RF reflected wave) relative to RF power, thereby increasing supply efficiency of the RF power.

As illustrated in FIG. 1, a control unit 80 changes adjustment positions of the first variable capacitor 57 and the second variable capacitor 58 by using the matching unit 53 according to ignition conditions calculated by an ignition control method to be described later. Accordingly, the capacitive elements C1 and C2 of the first variable capacitor 57 and the second variable capacitor 58 are respectively adjusted to adjust the impedance, thereby matching an output impedance of the RF power supply 55 with an impedance of a plasma (load) side. The matching unit 53 is equipped with a sensor (voltmeter) 56 to measure a voltage (a voltage across the distance D1 in FIG. 2) between electrodes.

[Gas Supply]

The plasma box 19 accommodates vertical pipes 41C for second and third gases. The second gas is ejected horizontally from the air inlet 42C of the vertical pipe 41C toward the opening 17 and is supplied to an inside of the body 12 of the processing container through the opening 17. Similarly, the third gas is ejected horizontally from the air inlet 42C of the vertical pipe 41C toward the opening 17 and is supplied to the inside of the body 12 of the processing container through the opening 17.

The vertical pipes 41A and 41B for the first gas are disposed outside the plasma box 19 and outside the opening 17 in the body 12 of the processing container. The vertical pipe 41B may be disposed inside the plasma box 19 for the third gas and may supply each gas separately from the vertical pipe 41C for the second gas.

By applying a radio-frequency voltage between the electrodes 91 and 92, a radio-frequency electric field is generated in an internal space of the plasma box 19. When the first gas is a source gas, the second gas is a reactive gas, and the third gas is a reforming gas, the reactive gas and the reforming gas are turned into a plasma by the radio-frequency electric field in the internal space of the plasma box 19. For example, when the reforming gas contains a hydrogen gas, the hydrogen gas is turned into a plasma, thereby generating hydrogen radicals. Active species such as hydrogen radicals are supplied to the inside of the body 112 of the processing container through the opening 17, and reform an adsorption layer of the source gas.

Figure 3:
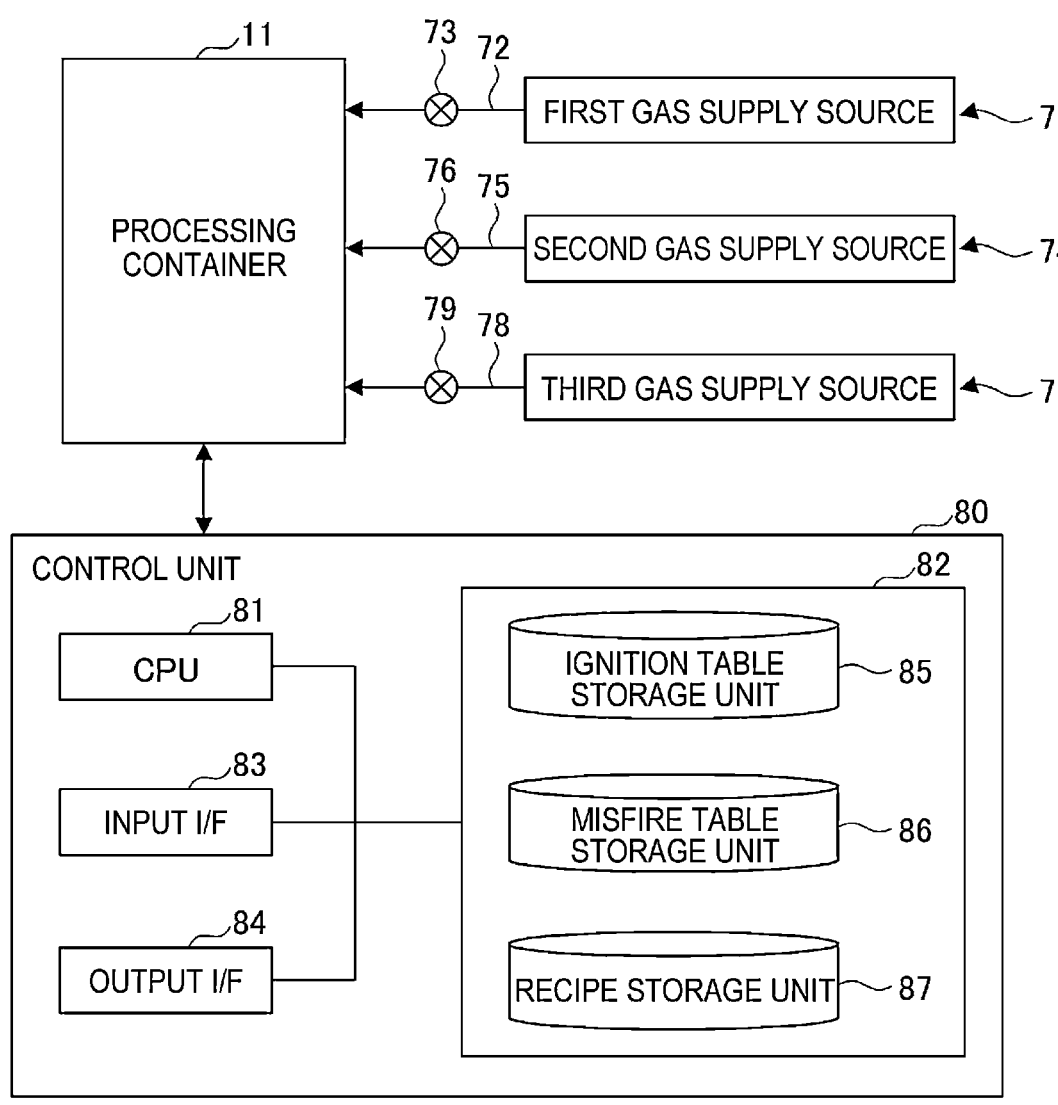
FIG. 3 is an explanatory diagram of a gas supply source and a control unit of the plasma processing apparatus.

The plasma processing apparatus 10 includes the control unit 80 that controls the plasma processing apparatus 10. FIG. 3 is an explanatory diagram of a gas supply unit and the control unit 80 of the plasma processing apparatus 10. In the plasma processing apparatus 10, the gas supply unit includes a first gas supply source 71, a second gas supply source 74, and a third gas supply source 77. The first gas supply source 71 supplies the first gas serving as the source gas to the inside of the processing container 11.

A first gas pipe 72 connects the first gas supply source 71 and gas supply pipes 40A and 40B to transfer the first gas (source gas) from the first gas supply source 71 to the gas supply pipes 40A and 40B. The first gas is ejected horizontally toward the wafer 2 from the air inlets 42A and 42B of the vertical pipes 41A and 41B. The first gas flow control valve 73 is provided in the middle of the first gas pipe 72 and controls a flow rate of the first gas.

The second gas supply source 74 supplies a second gas (reactive gas) to the inside of the processing container 11, thereby reacting the adsorption layer of the first gas with the second gas. A second gas pipe 75 connects the second gas supply source 74 and the gas supply pipe 40C to transfer the second gas from the second gas supply source 74 to the gas supply pipe 40C. The second gas is ejected horizontally toward the wafer 2 from the air inlet 42C of the vertical pipe 41C. The second gas flow control valve 76 is provided in the middle of the second gas pipe 75 and controls a flow rate of the second gas.

The third gas supply source 77 supplies a third gas (reforming gas) to the inside of the processing container 11 to reform a predetermined film. A third gas pipe 78 connects the third gas supply source 77 and the gas supply pipe 40C to transfer the third gas from the third gas supply source 77 to the gas supply pipe 40C. The third gas is ejected horizontally toward the wafer 2 from the air inlet 42C of the vertical pipe 41C. A third gas flow control valve 79 is provided in the middle of the third gas pipe 78 and controls a flow rate of the third gas. A purge gas supply source may be installed to supply a purge gas such as Ar gas from the purge gas supply source. The first to third gases remaining in the processing container 11 may be removed by the purge gas.

The control unit 80 is configured as, example, a computer, and includes a central processing unit (CPU) 81 and a memory 82, as illustrated in FIG. 3. The memory 82 stores programs that control various processes performed in the plasma processing apparatus 10. The control unit 80 controls an operation of the plasma processing apparatus 10 by causing the CPU 81 to execute the programs stored in the memory 82. The control unit 80 also includes an input interface 83 and an output interface 84. The control unit 80 receives control signals from the outside through the input interface 83, and transmits the control signals to the outside through the output interface 84. The output interface 84 may be connected to a display device provided inside or outside the control unit 80. The display device is an example of a display unit that displays ignition condition information and misfire condition information calculated by the ignition condition calculation method to be described later.

The program may be stored in a computer-readable medium and installed in the memory 82 of the control unit 80 from the medium. Examples of the computer-readable media include a hard disk (HD), a flexible disk (FD), a compact disk (CD), a magnet optical disk (MO), and a memory card. The program may be downloaded from a server via the Internet and installed in the memory 82 of the control unit 80.

The memory 82 stores various pieces of information used in the ignition condition calculation method. For example, the memory 82 includes an ignition table storage unit 85 that stores ignition condition information, a misfire table storage unit 86 that stores misfire condition information, and a recipe storage unit 87 that stores recipes in which process conditions are set. The ignition table storage unit 85 may store a plurality of ignition tables, the misfire table storage unit 86 may store a plurality of misfire tables, and the recipe storage unit 87 may store a plurality of recipes. The ignition table storage unit 85 and the misfire table storage unit 86 may be the same table storage unit.

[Ignition Condition Calculation Method]

Figure 4:
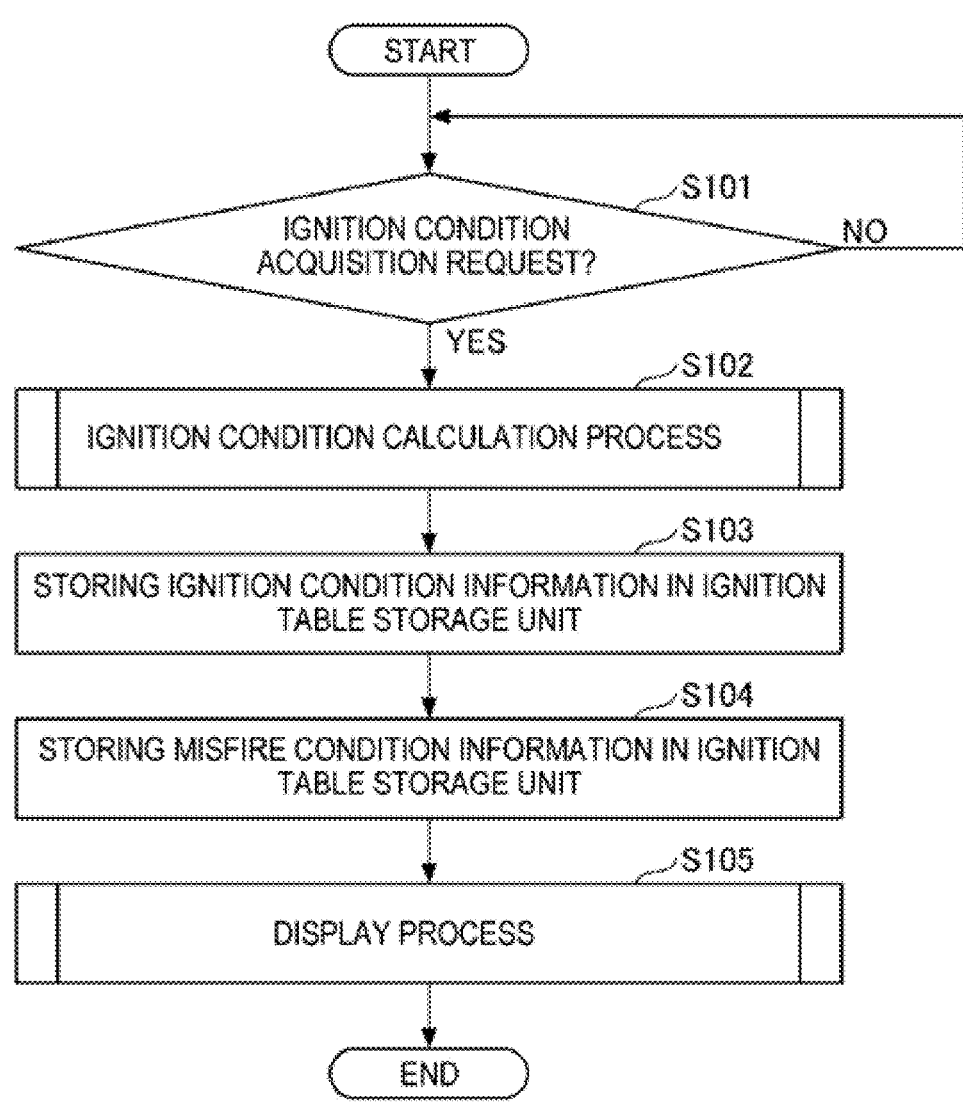
FIG. 4 is a flowchart illustrating an ignition condition calculation method.

An ignition condition calculation method according to the first embodiment will be described with reference to FIG. 4. FIG. 4 is a flowchart illustrating an ignition condition calculation method.

In step S101, the control unit 80 determines whether an ignition condition acquisition request has been received. The control unit 80 may determine that an ignition condition acquisition request has been received, for example, when a user presses an "optimum condition acquisition button 601" (see, e.g., FIG. 10) on a screen. The user may make an ignition condition acquisition request, for example, when starting up the plasma processing apparatus 10 or before executing a process based on a new recipe. The user may make an ignition condition acquisition request at another timing, in consideration of aging deterioration of the plasma processing apparatus 10.

When the control unit 80 receives the ignition condition acquisition request, the control unit 80 performs an ignition condition calculation process in step S102.

(Ignition Condition Calculation Process)

Figure 5:
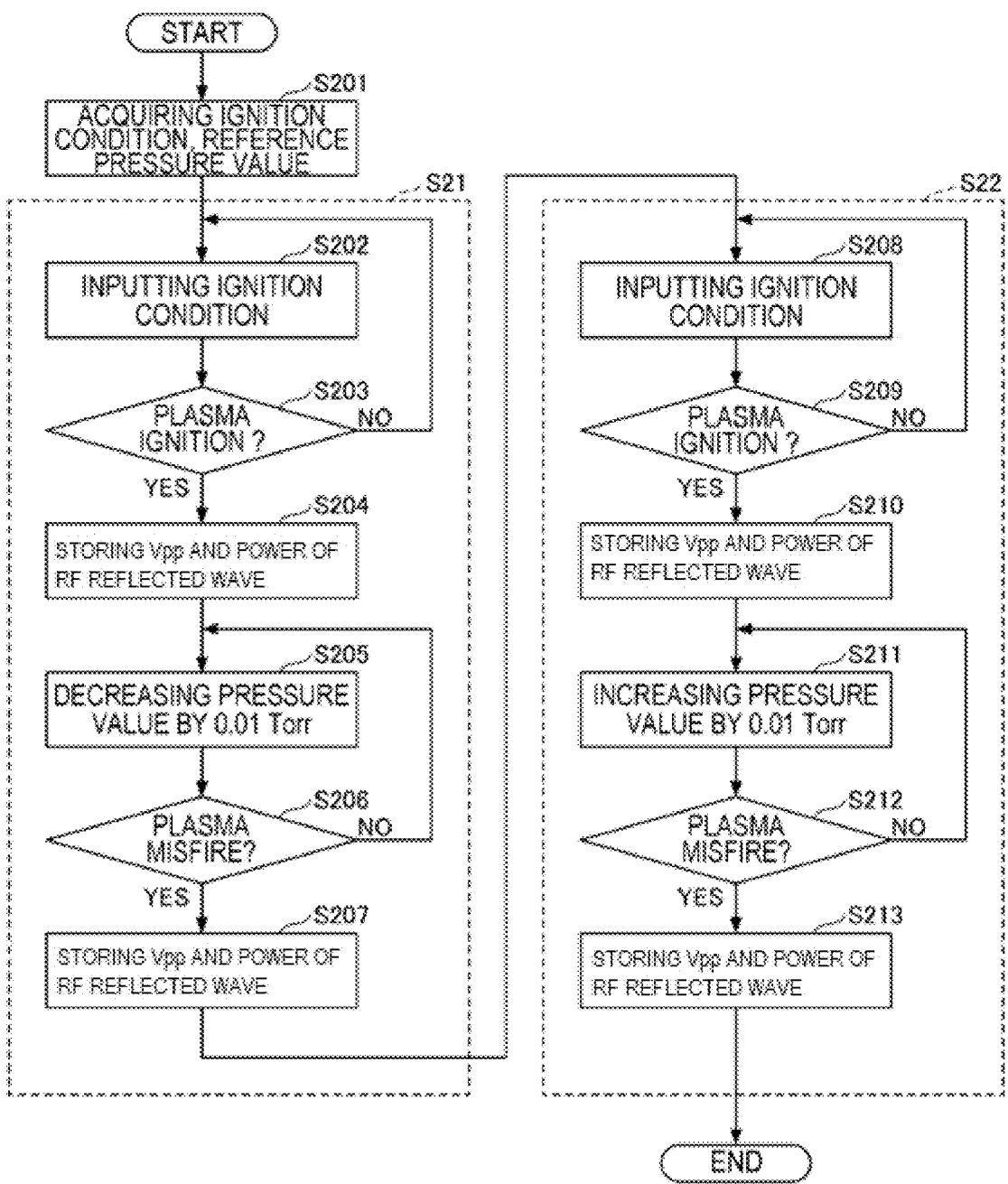
FIG. 5 is a flowchart illustrating an ignition condition calculation process.

FIG. 5 is a flowchart illustrating an ignition condition calculation process. The ignition condition calculation process in FIG. 5 is called when step S102 is performed.

In step S201, the control unit 80 acquires ignition conditions and a reference pressure value. The reference pressure value is set to a fiducial pressure value that is generally considered to cause ignition based on the Paschen's law, so that an efficient processing is performed.

In the ignition condition calculation process according to the first embodiment, a gas type, a gas flow rate, and a RF voltage are input as examples of input data for the ignition conditions, and Vpp and power of RF reflected waves are output in association with an adjusted pressure value, as examples of output data.

In step S202, the control unit 80 inputs the gas type, the gas flow rate, and the RF voltage, which are the ignition conditions. The control unit 80 inputs the reference pressure value and controls the plasma processing apparatus 10 based on process conditions including the input ignition conditions.

In step S203, the control unit 80 determines whether a plasma has been ignited. When the control unit 80 determines that the plasma has not been ignited, the control unit 80 returns to step S202, and changes and inputs at least one of the RF voltage and the pressure value among the ignition conditions.

When the control unit 80 determines that the plasma has been ignited in step S203, the control unit 80 stores the Vpp and power of the RF reflected wave measured in association with the input pressure value in an ignition condition table in step S204. The Vpp may be a peak-to-peak voltage of an output terminal voltage of the matching unit 53 measured by the sensor 56 of the matching unit 53 illustrated in FIG. 2 when a plasma is generated under ignition conditions at that time. The power of the RF reflected wave may be the power of the RF reflected wave (RF power) measured by a monitor unit (not illustrated) that monitors the RF power supply 55 when a plasma is generated under the ignition conditions at that time. A control signal indicating the measured Vpp and a control signal indicating the power of the RF reflected wave are transmitted from the sensor 56 and the monitor unit to the control unit 80.

FIG. 6 illustrates an ignition condition table. For example, in a case where a reference pressure value is 1.80 Torr, when the pressure in the ignition conditions is set to the reference pressure value in step S202, it is assumed that the plasma has not been ignited in step S203. When the pressure value is changed to 1.79 Torr in step S202, it is assumed that the plasma has been ignited in step S203. In this case, in step S204, a Vpp value "V12" and a power value "Pr12" of the RF reflected wave measured under the ignition conditions including the input pressure value of 1.79 Torr are stored in the ignition condition table.

In step S205, the control unit 80 decreases the pressure value from the current value by 0.01 Torr. In step S206, the control unit 80 determines whether the plasma has misfired. When the control unit 80 determines that the plasma has not misfired, the control unit 80 returns to step S205 and further decreases the pressure value by 0.01 Torr.

In step S206, the control unit 80 repeats the processes of steps S205 and S206 until the control unit 80 determines that the plasma has misfired. When the control unit 80 determines that the plasma has misfired in step S206, the control unit 80 stores the Vpp and power of RF reflected wave measured under misfire conditions including the current pressure value, in a misfire condition table in association with the current pressure value in step S207. The Vpp and the power of the RF reflected wave measured under the ignition conditions and misfire conditions are examples of numerical values that indicate a plasma state, and measurement targets are not limited to the Vpp and power of RF reflected wave as long as they are measurable values that indicate the plasma state.

FIG. 7 illustrates a misfire condition table. For example, in a case where the pressure value is set to 1.60 Torr in step S205, when it is determined in step S206 that the plasma has misfired, a measured Vpp "V14" and power "Pr14" of the RF reflected wave are stored as lower limit values in step S207.

Figure 8:
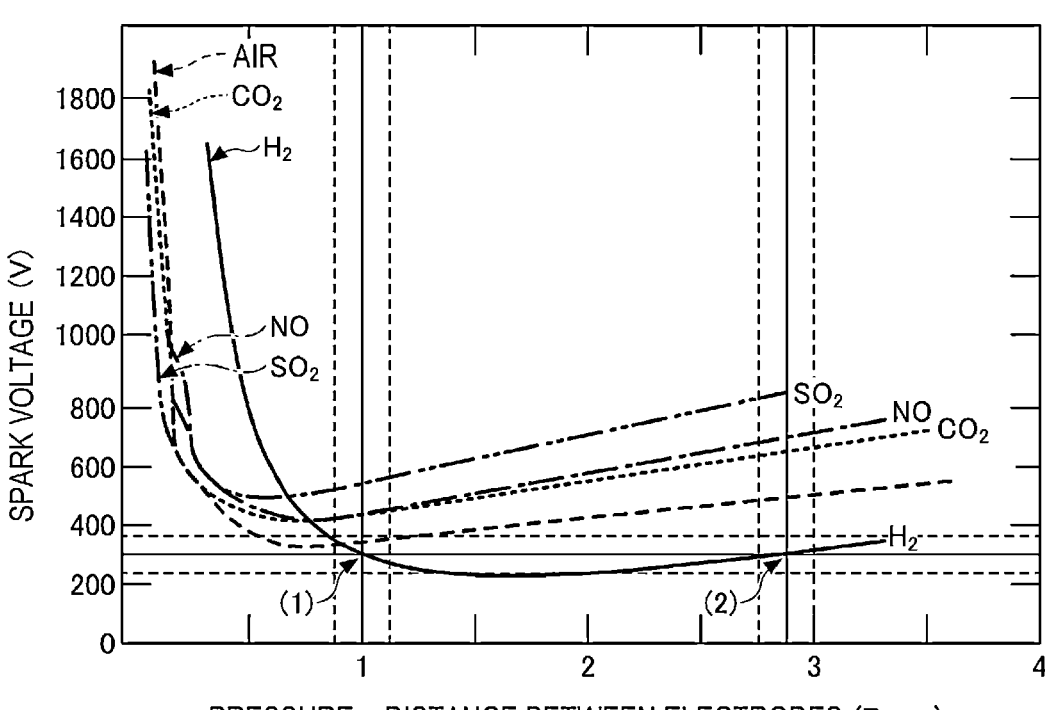
FIG. 8 is a diagram illustrating Paschen curves.

FIG. 8 is a diagram illustrating Paschen curves for various gases such as $H_2$ gas. A horizontal axis illustrates integrated values of the pressure in the processing container 11 and the distance D1 between the electrodes (see, e.g., FIG. 2), and a vertical axis illustrates a spark voltage (minimum ignition voltage) that indicates a discharge voltage required for plasma ignition.

In a case where a gas that is supplied to the processing container 11 is $H_2$ gas, when a voltage value input in the ignition condition is 300 V and the integrated value of the pressure and the distance D1 between the electrodes is about 1 or 2.8, the plasma ignites at points indicated by (1) and (2).

The steps S202 to S207 described above are a process S21 for searching for misfire conditions when the pressure value is decreased by 0.01 Torr toward a lower pressure side from the pressure value of the points indicated by (1) or (2).

As illustrated in FIG. 8, when an RF voltage of 300V is applied, two ignition points of (1) and (2) are determined. The pressure corresponding to either ignition point (1) or (2) depends on a pressure value set under the process conditions. The searching illustrated in FIG. 5 may be performed for either point (1) or (2) that has a pressure close to the process conditions.

As a result of the searching in S21, it may be confirmed that the plasma has misfired, as illustrated by a vertical dashed line indicated on the left of a vertical solid line passing through the point (1) or (2) in FIG. 8. The Vpp and the power of the RF reflected wave measured under misfire conditions at this time are stored in the misfire table as a lower limit value of Vpp and a lower limit value of the power of the RF reflected wave.

Steps S208 to S213, which will be described next, are a process S22 for searching for misfire conditions when the pressure value increases by 0.01 Torr toward a higher pressure side than the pressure value set in the ignition condition.

In step S208, the control unit 80 inputs a gas type, a gas flow rate, and a RF voltage, which are ignition conditions. The control unit 80 inputs a reference pressure value, and controls the plasma processing apparatus 10 based on process conditions including the input ignition condition.

In step S209, the control unit 80 determines whether the plasma has been ignited. When the control unit 80 determines that the plasma has not been ignited, the control unit 80 returns to step S208, and changes and input at least one of the RF voltage and the pressure value among the ignition conditions.

When the control unit 80 determines that the plasma has been ignited in step S209, the control unit 80 stores the Vpp and power of the RF reflected wave measured in association with the input pressure value, in the ignition condition table.

In the ignition condition table illustrated in FIG. 6, for example, in a case where the reference pressure value is 1.80 Torr, when the pressure of the ignition conditions is set to the reference pressure value in step S208, it is assumed that the plasma has not been ignited in step S209. When the pressure value is changed to 1.81 Torr in step S208, it is assumed that the plasma has been ignited in step S209. In this case, in step S210, a Vpp value "V13" and a power value "Pr13" of the RF reflected wave measured under ignition conditions including the input pressure value of 1.81 Torr are stored in the ignition condition table.

In this manner, after the ignition conditions are determined in the process S21 for searching for misfire conditions of a low pressure side, the ignition conditions are determined again in the process S22 for searching for misfire conditions of a high pressure side. This is because the ignition conditions determined in the process S21 do not necessarily coincide with the ignition conditions determined in the process S22.

In step S211, the control unit 80 increases the pressure value by 0.01 Torr from the current value. In step S212, the control unit 80 determines whether the plasma has misfired. When the control unit 80 determines that the plasma has not misfired, the control unit 80 returns to step S211 and further increases the pressure value by 0.01 Torr.

In step S212, the control unit 80 repeats the processes of steps S211 and S212 until it is determined that the plasma has misfired. When the control unit 80 determines that the plasma has misfired in step S212, the control unit 80 stores the Vpp and the power of the RF reflected wave measured under the misfire conditions including the current pressure value in the misfire condition table in association with the current pressure value, in step S213.

In the misfire condition table of FIG. 7, for example, in a case where the pressure value is set to 2.40 Torr in step S211, when it is determined that the plasma has misfired in step S212, measured Vpp "V15" and power "Pr15" of the RF reflected wave are stored as upper limit values of the misfire condition table in step S213.

As a result of the searching in S22, it may be confirmed that the plasma has misfired, as illustrated by a vertical dashed line indicated on the right of a vertical solid line passing through the point (1) or (2) in FIG. 8. The Vpp and the power of the RF reflected wave measured under the misfire conditions at this time are stored in the misfire table as an upper limit value of Vpp and an upper limit value of the power of the RF reflected wave.

As an example of the determination of ignition and misfire performed in steps S203, S206, S209, and S212, a plasma ignition sensor may be used to determine that the plasma has been ignited when the sensor is turned on, and that the plasma has misfired when the sensor is turned off. However, the sensor that may be used is not limited to the plasma ignition sensor. For example, a plasma color sensor may be used to detect an emission color of the plasma and may detect ignition and misfire of different gas types. The color of the plasma differs depending on the gas type. Therefore, in a process using multiple gas types, even when the gas type changes, the ignition and misfire of the plasma may be reliably determined by the plasma color sensor.

The Vpp and the power of the RF reflected wave may be used to determine the misfire of the plasma when they are outside of a predetermined range of Vpp and a predetermined range of the power of the RF reflected wave. The ignition and the misfire of the plasma may be determined by detecting a plasma emission intensity with a plasma emission sensor.

In steps S205 and S211, a unit by which the pressure value is decreased or increased is not limited to increments of 0.01 Torr. The unit by which the pressure value is decreased or increased may be preset by a user as a parameter value.

When the ignition condition calculation process of FIG. 5 is completed, the control unit 80 acquires ignition condition information from information stored in the ignition table, and stores the ignition condition information in the ignition table storage unit 85 in association with the table number, in step S103 of FIG. 4. The control unit 80 may acquires a midpoint of pressure values of ignition points, and store the Vpp and the voltage of the RF reflected wave when plasma ignition is performed under an ignition condition of the midpoint in the ignition table storage unit 85. In an example of FIG. 6, when the pressure values of the ignition point are two points, 1.79 and 1.81, "V11" indicating the Vpp and "Pr11" indicating the voltage of the RF reflected wave when ignition is performed with the pressure value of 1.80, which is the midpoint, may be stored in the ignition table storage unit 85 in association with 1.80 of the pressure value. The V11 of Vpp, the Pr11 of the RF power, and 1.80 of the pressure are examples of ignition condition information.

When the midpoint has a value with a decimal point less than 0.01 Torr, such as 1.805, the Vpp and the voltage of the RF reflected wave for either of two points of values with two decimal places closest to the midpoint, that is, either of the two points, 1.81 or 1.80 in the above example, may be acquired and stored in the ignition table storage unit 85.

For example, an ignition table in FIG. 6 is named table 1 and stored in the ignition table storage unit 85. The ignition condition information may include the input ignition conditions (the gas type, the gas flow rate, and the RF voltage), in addition to the pressure, the Vpp, and the power of the RF reflected wave.

In step S104, the control unit 80 acquires misfire condition information from information stored in the misfire table, and stores the misfire condition information in the misfire table storage unit 86 in association with the table number. For example, the misfire table in FIG. 7 is named Table 1, and an upper limit value and a lower limit value of the Vpp and the power of the RF reflected wave are stored in the misfire table storage unit 86. The misfire condition information may include the input misfire conditions (the gas type, the gas flow rate, and the RF voltage) in addition to the pressure, the upper limit value and the lower limit value of the Vpp and the power of the RF reflected wave. The table number such as Table 1 is an example of identification information of the ignition condition information and the misfire condition information.

In step S105, the control unit 80 performs a display process.

(Display Process)

Figure 9:
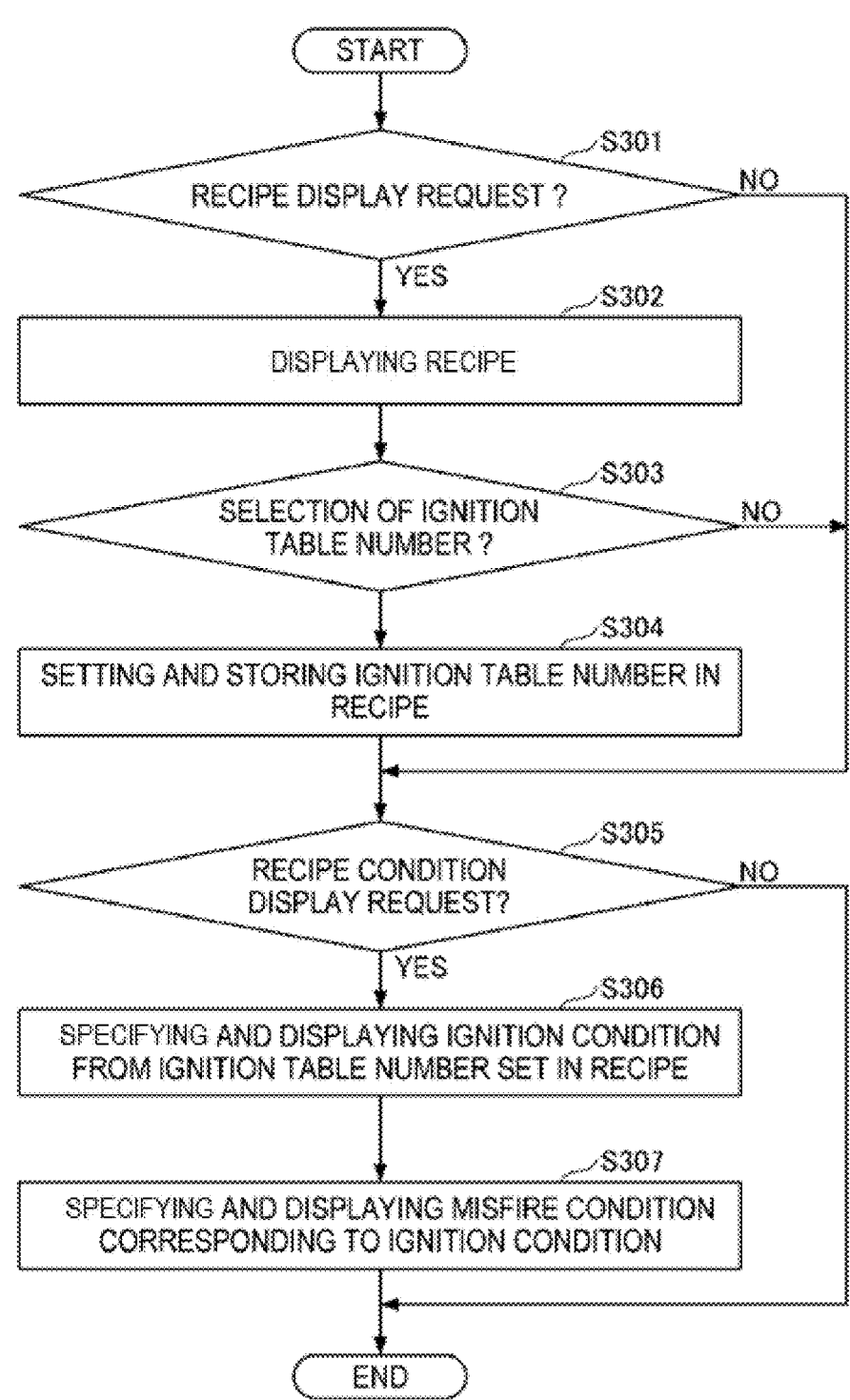
FIG. 9 is a flowchart illustrating a display process.

FIG. 9 is a flowchart illustrating a display process. The display process in FIG. 9 is called when step S105 is performed.

In step S301, the control unit 80 determines whether a recipe display request has been received. The control unit 80 may determine that a recipe display request has been received, for example, when a user presses a "recipe display button 602" (see, e.g., FIG. 10) on a screen.

When the control unit 80 determines that the recipe display request has not been received in step S301, the control unit 80 proceeds to step S305. When the control unit 80 determines that the recipe display request has been received in step S301, the control unit 80 displays the recipe whose display has been required, in step S302. FIG. 10 illustrates a recipe 501 displayed in response to pressing the recipe display button 602. This allows the user to easily check the contents of the recipe.

In the recipe 501, process conditions for each of a plurality of steps STEP 1, STEP 2, STEP 3, . . . of recipe A 502 are displayed. The process conditions for each step of recipe A 502 include an end time 503, a pressure 504, a RF voltage (RF power) 505, a gas type and gas flow rate 506 of the first gas, a gas type and gas flow rate 507 of a second gas, a gas type and gas flow rate 508 of a third gas, an antenna position 509, and an ignition table number 510. The antenna position 509 is not included in the process conditions of the recipe in the first embodiment, but is included in the process conditions of the recipe in the second embodiment, and thus, will be described in the second embodiment. A dashed line in an ignition table 510 indicates that it is displayed selectably.

In step S303, the control unit 80 determines whether the control unit 80 has received a selection of the ignition table number displayed selectably in each step of the ignition table 510 among the process conditions. When the control unit 80 determines that the table number displayed selectably has been selected by a user, the control unit 80 sets the table number selected in the corresponding step of the recipe and stores the table number in the recipe storage unit 87 in step S304.

In an example of FIG. 10, table 1 is selected as an ignition table to be used in step 1, table 2 is selected as an ignition table to be used in step 2, and table 3 is selected as an ignition table to be used in step 3. By setting table numbers in this manner in the recipe, optimum ignition condition information may be set on a table-by-table basis and read in on a table-by-table basis. However, the optimum ignition conditions are not limited to being stored in table format and may be stored in any format.

In step S305, the control unit 80 determines whether a recipe condition display request has been received. The control unit 80 may determine that a recipe condition display request has been received, for example, when a user presses "a recipe condition display button 603" (see, e.g., FIG. 10) on a screen.

In step S305, when the control unit 80 determines that the recipe condition display request has not been received, the control unit 80 terminates the processing. In step S305, when the control unit 80 determines that the recipe condition display request has been received, the control unit 80 searches the ignition table storage unit 85, and specifies and displays ignition condition information from the table number set in the recipe. This allows the user to easily check optimum ignition conditions in process conditions of a specific recipe.

In step S307, the misfire table storage unit 86 is searched, and misfire condition information linked to table 1 is specified and displayed. This allows the user to easily check the misfire condition information (misfire range) under process conditions of a specific recipe.

In addition, when an actual process based on the recipe is performed, information on at least one of plasma ignition and plasma misfire may be displayed based on the ignition condition information and the misfire condition information identified by the table number set in the recipe. When a Vpp or voltage of the RF reflected wave that falls outside the misfire condition information (misfire range) is measured, an alarm notifying of plasma misfire may be displayed.

Second Embodiment

Next, a plasma processing apparatus that executes an ignition condition calculation method according to the second embodiment will be described.

[Plasma Processing Apparatus]

Figure 11:
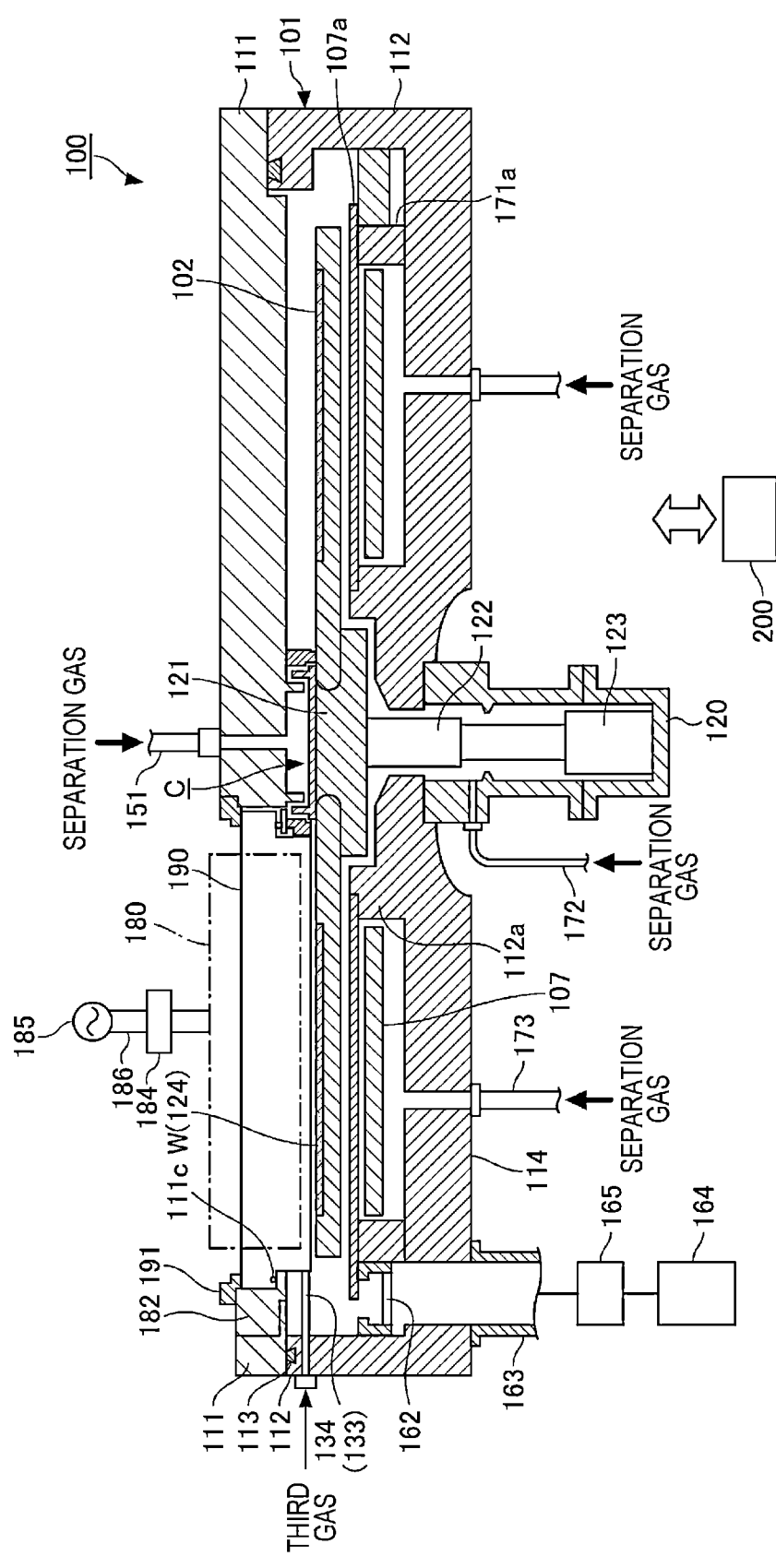
FIG. 11 is a schematic longitudinal cross-sectional view illustrating a plasma processing apparatus according to a second embodiment of the present disclosure.
Figure 12:
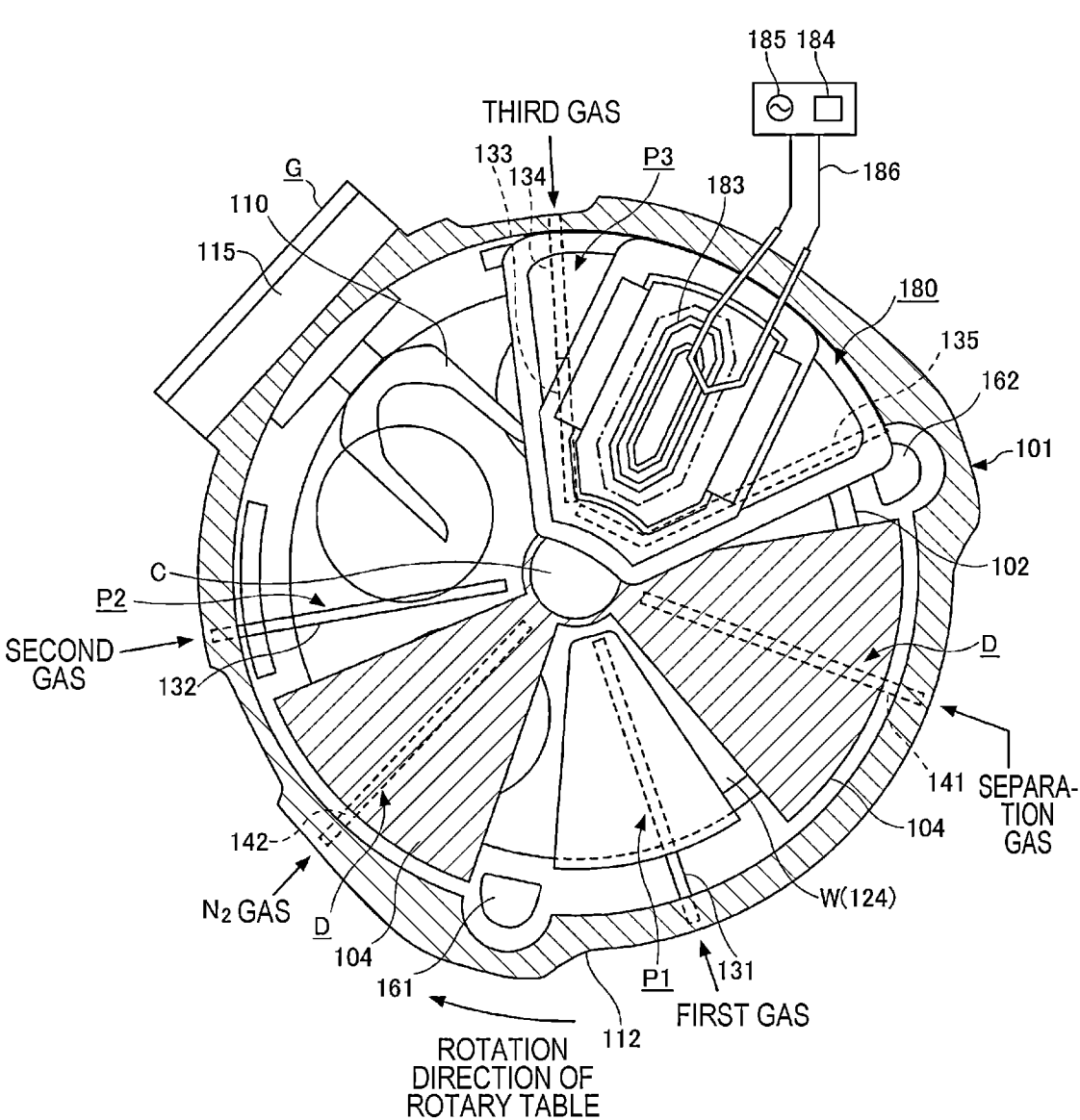
FIG. 12 is a schematic plan view illustrating the plasma processing apparatus.
Figure 13:
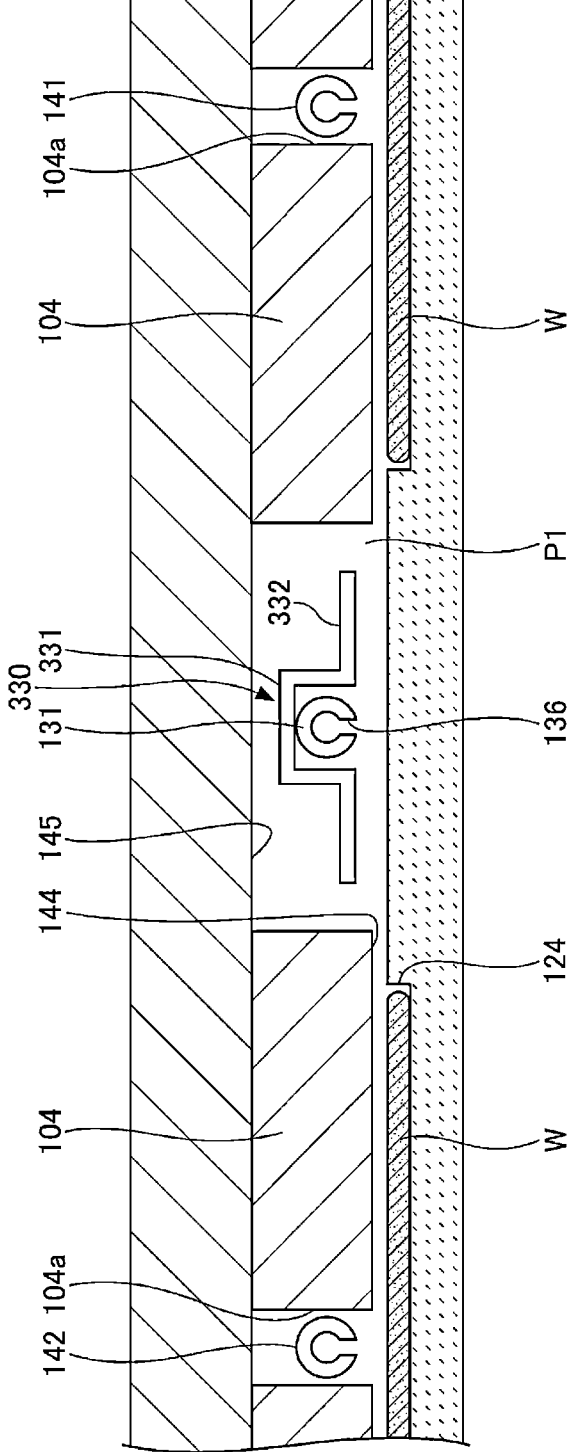
FIG. 13 is a cross-sectional view along a concentric circle of a rotary table of the plasma processing apparatus.
Figure 14:
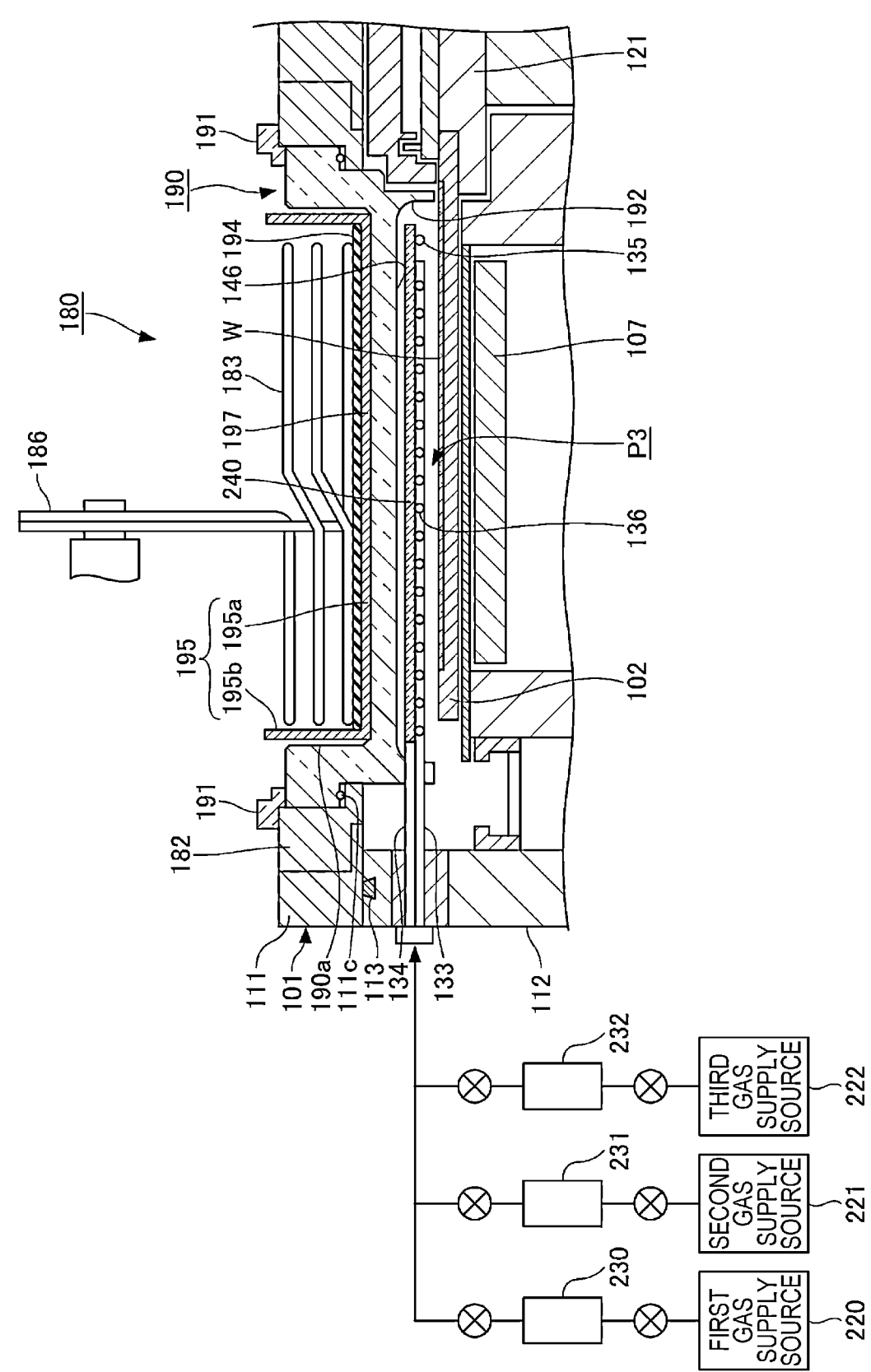
FIG. 14 is a longitudinal cross-sectional view of a plasma generation unit of the plasma processing apparatus.

A plasma processing apparatus 100 according to the second embodiment will be described with reference to FIGS. 11 to 14. FIG. 11 is a schematic longitudinal cross-sectional view illustrating the plasma processing apparatus 100 according to the second embodiment. FIG. 12 is a schematic plan view illustrating the plasma processing apparatus 100. FIG. 13 is a cross-sectional view taken along a concentric circle of a rotary table of the plasma processing apparatus 100. FIG. 14 is a longitudinal cross-sectional view of a plasma generation unit of the plasma processing apparatus 100. For convenience of explanation, the illustration of an upper wall 111 is omitted in FIG. 12. The plasma processing apparatus 100 according to the second embodiment is a semi-batch type apparatus.

As illustrated in FIGS. 11 and 12, the plasma processing apparatus 100 includes a processing container (vacuum container) 101 having a substantially circular planar shape, and a rotary table 102 installed within the processing container 101 and having a center of rotation at the center of the processing container 101 while rotating a wafer W, which is an example of a substrate.

The processing container 101 is a processing chamber for accommodating the wafer W to perform a plasma processing on a film formed on a surface of the wafer W. The processing container 101 includes the upper wall 111 and the body 112 of the processing container. The upper wall 111 and the body 112 of the processing container are sealed by a sealing member 113. The upper wall 111 is configured to be detachable from the body 112 of the processing container.

A separation gas supply pipe 151 is connected to a central portion of an upper surface inside the processing container

101 to supply a separation gas in order to suppress mixing of different processing gases in a central area C within the processing container 101.

The rotary table 102 is fixed to a core portion 121 having a substantially cylindrical shape at the center thereof, and is configured to be rotatable about a rotation axis 122 that is connected to a lower surface of the core portion 121, around a vertical axis (e.g., in a clockwise direction in an example of FIG. 12) by a driving unit 123.

The rotation axis 122 and the driving unit 123 are accommodated in a case body 120. The case body 120 has a flange portion on an upper surface thereof, which is hermetically attached to a lower surface of a bottom portion 114 of the body 112 of the processing container. A purge gas supply pipe 172 for supplying nitrogen gas serving as a purge gas (separation gas) to a lower area of the rotary table 102, is connected to the case body 120. An outer periphery of the core portion 121 in the bottom portion 114 is formed in a ring shape so as to approach the rotary table 102 from a lower portion, thereby forming a protrusion 112*a*.

A concave portion 124 having a circular shape is formed as a substrate placement area in a surface of the rotary table 102 to place a wafer W therein. The concave portion 124 is provided at a plurality of points, for example, five points, along a rotation direction of the rotary table 102. The concave portion 124 has an inner diameter that is slightly greater than a diameter of the wafer W. A depth of the concave portion 124 is configured to be approximately equal to a thickness of the wafer W, or greater than the thickness of the wafer W. Therefore, when the wafer W is accommodated in the concave portion 124, the surface of the wafer W and a surface of a flat area of the rotary table 102 where the wafer W is not disposed become the same height, or the surface of the wafer W becomes lower than the surface of the rotary table 102. In addition, through-holes (not illustrated) through which, for example, three lifting pins for pushing and lifting the wafer W from the lower portion are passed, are formed in a bottom surface of the concave portion 124.

As illustrated in FIG. 12, a first processing area P1, a second processing area P2, and a plasma generation area P3 are formed to be spaced apart from each other along the rotation direction of the rotary table 102. At a position facing a passage area of the concave portion 124 in the rotary table 102, a plurality of gas nozzles, e.g., seven gas nozzles 131, 132, 133, 134, 135, 141 and 142 made of, for example, quartz are disposed radially to be spaced apart from each other in a circumferential direction of the processing container 101. Each of the gas nozzles 131 to 135, 141 and 142 is disposed between the rotary table 102 and the upper wall 111. Each of the gas nozzles 131 to 135, 141 and 142 is attached to extend horizontally from an outer circumferential wall of the processing container 101 toward the central area C so as to face the wafer W, for example. Meanwhile, the gas nozzle 135 may extend from the outer circumferential wall of the processing container 101 toward the central area C and then, bend and extend in a counterclockwise direction (e.g., in a direction opposite to the rotation direction of the rotary table 102) to linearly follow the central area C. In the example illustrated in FIG. 12, plasma processing gas nozzles 133 and 134 (gas nozzles 133 and 134 for a plasma processing), a plasma processing gas nozzle 135, a separation gas nozzle 141, a first gas nozzle 131, a separation gas nozzle 142, and a second gas nozzle 132 are arranged in this order in a clockwise direction (e.g., the rotation direction of the rotary table 102) from a transfer port 115. A gas supplied by the second gas nozzle 132 may be often a gas of the same quality as a gas supplied by the plasma processing gas nozzles 133 to 135. However, when the gas is sufficiently supplied by the plasma processing gas nozzles 133 to 135, it is not necessary to install the second gas nozzle 132.

The first gas nozzle 131 constitutes a first gas supply unit. The second gas nozzle 132 constitutes a second gas supply unit. Furthermore, each of the plasma processing gas nozzles 133 to 135 constitutes a plasma processing gas supply unit (gas supply unit for a plasma processing). Each of separation gas nozzles 141 and 142 serves as a separation gas supply unit.

As illustrated in FIG. 14, the first gas supply unit, the second gas supply unit, and the plasma processing gas supply unit are connected to a first gas supply source 220, a second gas supply source 221, and a third gas supply source 222, respectively, through flow rate controllers 230, 231, and 232. The first gas, the second gas, and the third gas are supplied to the plasma processing gas nozzles 133 to 135 from the first gas supply source 220, the second gas supply source 221, and the third gas supply source 222, respectively, through the flow rate controllers 230, 231, and 232. The first gas, the second gas, and the third gas may be different gas species. When a single plasma processing gas nozzle is provided, for example, a mixed gas of the above-mentioned first gas, second gas, and third gas is supplied to the single plasma processing gas nozzle. The first gas may be Ar gas, the second gas may be He gas, and the third gas may be $O_2$ gas. On a lower surface side of the gas nozzles 131 to 135, 141, and 142, gas ejection holes 136 are formed at a plurality of points, for example, at equal intervals, along a radial direction of the rotary table 102.

As illustrated in FIG. 12, a lower area of the first gas nozzle 131 is a first processing area P1 for adsorbing the first gas to the wafer W, and a lower area of the second gas nozzle 132 is a second processing area P2 for supplying the wafer W with a second gas capable of reacting with the first gas. A lower area of the plasma processing gas nozzles 133 to 135 is the plasma generation area P3 for performing a plasma (reforming) processing of a film on the wafer W. The separation gas nozzles 141 and 142 are provided to form separation areas D that separate the first processing area P1, the second processing area P2, and the plasma generation area P3. The separation area D is provided between the second processing area P2 and the plasma generation area P3. This is because, in the second gas supplied from the second processing area P2 and the mixed gas (third gas) supplied from the plasma generation area P3, the mixed gas often contains some of components in common with the second gas, so there is no need to use a separation gas to separate the second processing area P2 from the plasma generation area P3.

From the first gas nozzle 131, a source gas constituting a main component of a film to be formed is supplied as the first gas. From the second gas nozzle 132, a reactive gas that may react with the source gas is supplied as the second gas. From the plasma processing gas nozzles 133 to 135, the third gas is supplied to perform a plasma (reforming) processing of the formed film. The third gas may be a mixed gas containing a gas similar to the second gas and a rare gas. Here, since the plasma processing gas nozzles 133 to 135 are configured to supply a gas to different areas on the rotary table 102, a flow rate ratio of the rare gas may be different for each area, so that a plasma processing is performed uniformly overall.

The transfer port 115 is provided to be opened and closed by a gate valve G. When the gate valve G is opened, a fork 110 of a transfer arm is inserted from the transfer port 115, and the wafer W on the fork 110 is transferred to a lift pin (not illustrated). The transfer arm then retreats from the transfer port 115.

FIG. 13 is a cross-sectional view from the separation area D to the separation area D through the first processing area P1. A roughly fan-shaped convex portion 104 is provided on the upper wall 111 of the processing container 101 in the separation area D. The convex portion 104 is attached to a back surface of the upper wall 111, and within the processing container 101, a flat ceiling surface 144 (first ceiling surface) which is a lower surface of the convex portion 104, and a ceiling surface 145 (second ceiling surface) which is higher than the ceiling surface 144 and is located on both sides of the ceiling surface 144 in the circumferential direction are formed.

The convex portion 104 forming the ceiling surface 144 has a fan-shaped planar shape with a top portion cut into an arc shape, as illustrated in FIG. 12. Also, as illustrated in FIG. 13, the convex portion 104 includes a groove portion 104a formed to extend in a radial direction at a circumferential center thereof, and the separation gas nozzles 141 and 142 are accommodated in the groove portion 104a.

A nozzle cover 330 is provided above the first gas nozzle 131 to allow the first gas to flow along the wafer W and to allow the separation gas to flow along the upper wall 111 of the processing container 101 while avoiding the vicinity of the wafer W. The nozzle cover 330 includes a cover body 331 for accommodating the first gas nozzle 131 and a distribution plate 332.

As illustrated in FIG. 12, a plasma generation unit 180 is provided above the plasma processing gas nozzles 133 to 135 to generate a plasma from the plasma processing gas (third gas) ejected into the processing container 101.

As illustrated in FIG. 12, exhaust ports 161 and 162 are located outside the rotary table 102. This allows a gas ejected from ejection holes of each gas nozzle to flow toward the exhaust ports 161 and 162. As illustrated in FIG. 11, a pressure regulator 164 is connected to an exhaust pipe 163 provided at the bottom portion 114 of the body 112 of the processing container, thereby adjusting the pressure within the processing container 101. An exhaust unit 165 is connected to the pressure regulator 164, thereby reducing the pressure within the processing container 101.

A heater unit 107 having a ring-shape is provided in a space between the rotary table 102 and the bottom portion 114, so that the wafer W placed on the rotary table 102 is heated to a predetermined temperature. A block member 171a is provided below and near an outer periphery of the rotary table 102 so as to surround the heater unit 107, thereby partitioning the space in which the heater unit 107 is placed from an area outside the heater unit 107. A small gap is formed between an upper surface of the block member 171a and a lower surface of the rotary table 102 to prevent a gas from flowing inwardly from the block member 171a. In an area in which the heater unit 107 is accommodated, a plurality of purge gas supply pipes 173 are connected at predetermined angular intervals so to penetrate the bottom portion 114 of the body 112 of the processing container in order to purge the area. A protective plate 107a is provided above the heater unit 107 to protect the heater unit 107. Accordingly, it possible to protect the heater unit 107 from a gas.

As illustrated in FIG. 14, the plasma generation unit 180 is configured by winding an antenna 183 made of a metal wire into a coil shape. The plasma generation unit 180 is disposed to surround a belt-shaped area extending in a diameter direction of the rotary table 102 when viewed from a plan view, and also to span a diameter portion of the wafer W on the rotary table 102.

The antenna 183 is connected to an RF power supply 185 having a frequency of, for example, 13.56 MHz through a matching unit 184. The antenna 183 is installed so as to be airtightly partitioned from an internal area of the processing container 101. In FIG. 11 and FIG. 12, a connection electrode 186 is installed to electrically connect the antenna 183 to the matching unit 184 and the RF power supply 185.

The antenna 183 is configured to be automatically bent vertically by a vertical movement mechanism (not illustrated), but the details thereof are omitted in FIG. 14. For example, both ends of the antenna 183 may be installed to be moved vertically so that a height (antenna position) is variable in the vertical direction. One end of the antenna 183 may be moved vertically such that an inclination (antenna position) is variable. By changing a position (height or inclination) of the antenna 183, an area where plasma density is concentrated may be moved. Accordingly, it is possible to increase in-plane uniformity of a film thickness at the center and the outer periphery of the wafer W.

As illustrated in FIG. 14, an ion trap plate 240 is disposed above the plasma processing gas nozzles 133 to 135. The ion trap plate 240 is a shielding plate for limiting the supply of generated plasma ions to the wafer W and improving the in-plane uniformity of the plasma processing.

As illustrated in FIGS. 11 and 14, a housing 190 is airtightly provided on an inner circumferential surface of an annular member 182 provided on the upper wall 111. An upper peripheral portion of the housing 190 extends horizontally in a flange shape in a circumferential direction, thereby forming a flange portion 190a, and a central portion of the housing 190 is formed to be recessed toward the internal area of the processing container 101 at a lower side when viewed in a plan view. The annular member 182 is airtightly installed at a position where an inner circumferential side thereof faces the flange portion 190a. Through the annular member 182, the housing 190 made of a guide material such as quartz is installed in an opening of the upper wall 111 in order to position the antenna 183 below the upper wall 111. A bottom surface of the housing 190 forms a ceiling surface 146 of the plasma generation area P3.

When the wafer W is positioned below the housing 190, the housing 190 is disposed to span the diameter portion of the wafer W in the diameter direction of the rotary table 102. A sealing member 111c such as an O-ring is provided between the annular member 182 and the housing 190. The housing 190 is pressed downward in the circumferential direction by a pressing member 191 formed in a frame shape to follow a contact portion between the annular member 182 and the housing 190 and an upper surface of the annular member 182 and the housing 190. The pressing member 191 is fixed to the upper wall 111 by bolts (not illustrated). Accordingly, an internal atmosphere of the processing container 101 is set to be airtight.

As illustrated in FIG. 14, a protrusion 192 is formed on a lower surface of the housing 190, which extends vertically toward the rotary table 102 so as to surround the processing area P3 in a lower portion of the housing 190 in the circumferential direction. In an area surrounded by an inner circumferential surface of the protrusion 192, the lower surface of the housing 190, and an upper surface of the rotary table 102, the aforementioned plasma processing gas nozzles 133 to 135 are accommodated.

Next, a Faraday shield 195 of the plasma generation unit 180 will be described. As illustrated in FIG. 14, a grounded Faraday shield 195, which is a conductive plate-like body formed to roughly follow an internal shape of the housing 190, is accommodated in the housing 190. The Faraday shield 195 includes a horizontal surface 195a that is horizontally engaged to follow a bottom surface of the housing 190, and a vertical surface 195b that extends upward in the circumferential direction from an outer end of the horizontal surface 195a.

When an electric field reaches the wafer W, electrical wiring formed inside the wafer W may be electrically damaged. Therefore, a number of slits 197 are formed in the horizontal surface 195a to prevent an electric field component of an electromagnetic field generated in the antenna 183 from being directed toward the wafer W therebelow and to allow a magnetic field to reach the wafer W. In FIG. 12, to provide simplicity, the slits 197 are omitted, and an example of a formation area of the slits 197 is illustrated by a dash-dotted line.

The slits 197 are formed below the antenna 183 in the circumferential direction so as to extend in a direction perpendicular to a winding direction of the antenna 183. As illustrated in FIG. 14, an insulation plate 194 is stacked on the horizontal surface 195a of the Faraday shield 195 to ensure insulation between the plasma generation unit 180 and the Faraday shield 195. That is, the plasma generation unit 180 is disposed to cover an inner portion of the processing container 101 (the wafer W on the rotary table 102) through the housing 190, the Faraday shield 195, and the insulation plate 194.

As illustrated in FIG. 11, the plasma processing apparatus 100 includes a control unit 200 that controls the plasma processing apparatus 100. The control unit 200 is configured, for example, as a computer, and includes a central processing unit (CPU), a memory, an input interface, and an output interface. The configuration of the control unit 200 is similar to the configuration of the control unit 80.

The memory stores various pieces of information used in an ignition condition calculation method. For example, the memory includes an ignition table storage unit that stores ignition conditions, a misfire table storage unit that stores misfire conditions, and a recipe storage unit that stores recipes storing process conditions. The ignition table storage unit stores a plurality of ignition tables, the misfire table storage unit stores a plurality of misfire tables, and the recipe storage unit stores a plurality of recipes.

[Ignition Condition Calculation Method]

The ignition condition calculation method according to the second embodiment will be described with reference to FIGS. 4 and 15. The ignition condition calculation method according to the second embodiment performs a processing according to the flowchart illustrated in FIG. 4, similar to the first embodiment.

When the control unit 200 receives an ignition condition acquisition request in step S101, the control unit 200 performs an ignition condition calculation process in step S102. In step S102, the control unit 200 may perform the ignition condition calculation process illustrated in FIG. 5 as in the first embodiment. Hereinafter, an example of performing the ignition condition calculation process illustrated in FIG. 15 instead of the ignition condition calculation process illustrated in FIG. 5 will be described.

(Ignition Condition Calculation Process)

Figure 15:
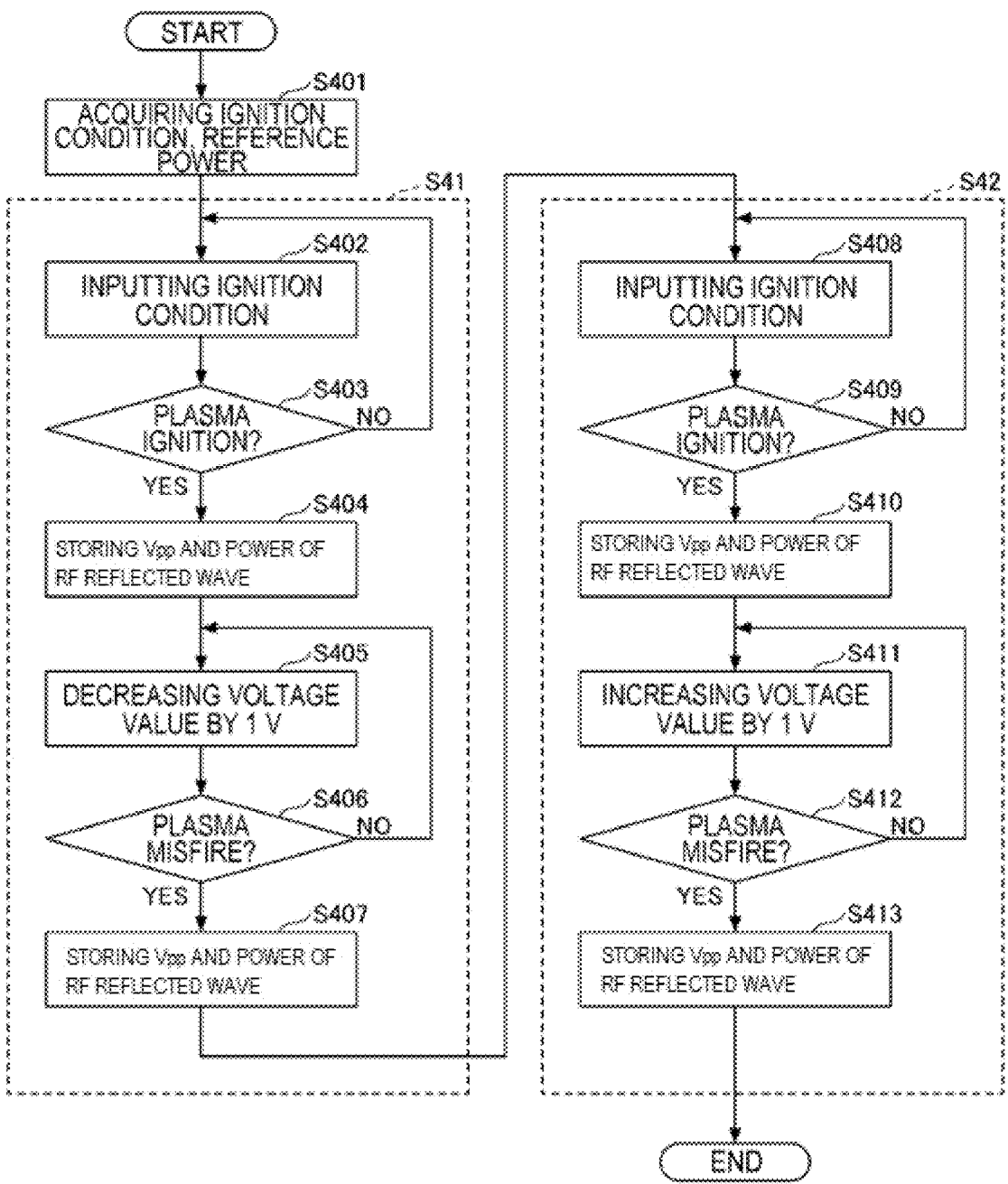
FIG. 15 is a flowchart illustrating an ignition condition calculation process.

FIG. 15 is a flowchart illustrating an ignition condition calculation process. The ignition condition calculation process in FIG. 15 is called when step S102 is performed.

In FIG. 15, the control unit 200 acquires ignition conditions and a reference RF voltage value in step S401. The reference RF voltage value is set as a fiducial RF voltage value that is generally considered to cause ignition based on the Paschen's law, so that an efficient processing is performed.

In the ignition condition calculation process according to the first embodiment, a gas type, a gas flow rate, and a RF voltage are input as examples of input data for the ignition conditions, and Vpp and power of RF reflected waves are output in association with the antenna position and the adjusted RF voltage value, as examples of output data.

In step S402, the control unit 200 inputs the gas type, the gas flow rate, the pressure, and the antenna position, which are the ignition conditions. The control unit 200 inputs the reference RF voltage value, and controls the plasma processing apparatus 100 based on process conditions including the input ignition conditions.

In step S403, the control unit 200 determines whether the plasma has been ignited. When the control unit 200 determines that the plasma has not been ignited, the control unit 200 returns to step S402, and changes and inputs at least one of the RF voltage and the pressure value among the ignition conditions.

When the control unit 200 determines that the plasma has been ignited in step S403, the control unit 200 stores the Vpp and the power of the RF reflected wave measured in association with the antenna position and the RF voltage value, in the ignition condition table in step S404. In the ignition condition at this time, a voltmeter of the matching unit 184 illustrated in FIGS. 11 and 12 may measure a peak-to-peak voltage Vpp of the output terminal voltage of the matching unit 184. A monitor unit (not illustrated) that monitors the RF power supply 185 may measure a radio-frequency power of a reflected wave of RF power (the power of the RF reflected wave). A control signal indicating the measured Vpp and a control signal indicating the power of the RF reflected wave are transmitted from the voltmeter and the monitor unit to the control unit 200.

FIG. 16 illustrates an example of an ignition condition table. For example, in a case where the antenna position is "1" and the reference RF voltage value is 300V, when the RF voltage value among the ignition conditions is set to the reference RF voltage value in step S402, it is assumed that the plasma is not ignited in step S403. Then, when the RF voltage value is changed to 299V in step S402, it is assumed that the plasma is ignited in step S403. In this case, in step S404, a Vpp value "70" and a power value "Pr22" of the RF reflected wave for measuring a plasma state under the ignition conditions including the input RF voltage value of 299V, are stored in the ignition condition table.

In step S405, the control unit 200 decreases the RF voltage value by 1V from the current value. In step S406, the control unit 200 determines whether the plasma has misfired. When the control unit 200 determines that the plasma has not been misfired, the control unit 200 returns to step S405 and further decreases the RF voltage value by 1V.

In step S406, the control unit 200 repeats the processes of steps S405 and S406 until the control unit 200 determines that the plasma has misfired. When the control unit 200 determines that the plasma has misfired in step S406, the control unit 200 stores the Vpp and the power of the RF reflected wave measured under misfire conditions including the current RF voltage value in association with the antenna position and the current RF voltage value in a misfire condition table, in step S407. The Vpp and the power of RF reflected wave measured under the ignition conditions and the misfire conditions are examples that indicate a plasma state, and measurement targets are not limited to the Vpp and the power of the RF reflected wave, as long as they are measurable values indicating the plasma state.

FIG. 17 illustrates a misfire condition table. For example, in a case where the RF voltage value is set to 295 V in step S405, when it is determined that the plasma has misfired in step S406, a lower limit value "50" of the measured Vpp and a lower limit value of the power of the RF reflected wave (not illustrated) in association with the antenna position "1" are stored in the misfire condition table in step S407. Although omitted in FIG. 17, the RF voltage value "295 V" when the plasma has misfired is also stored in association with the lower limit values of the measured Vpp and power of the RF reflected wave.

The above-described steps S402 to S407 are a process S41 for searching for misfire conditions when the RF voltage value is decreased by 1 V toward a lower voltage side.

The next steps S408 to S413 are a process S42 for searching for misfire conditions when the RF voltage value is increased by 1 V toward a higher voltage side from the RF voltage value determined by the ignition conditions.

In step S408, the control unit 200 inputs the gas type, the gas flow rate, the pressure, and the antenna position, which are the ignition conditions. The control unit 200 also inputs the reference RF voltage value, and controls the plasma processing apparatus 100 based on process conditions including the input ignition conditions.

In step S409, the control unit 200 determines whether the plasma has been ignited. When the control unit 200 determines that the plasma has not been ignited, the control unit 200 returns to step S408 and changes and inputs at least one of the RF voltage and the pressure value among the ignition conditions.

When the control unit 200 determines that the plasma has been ignited in step S409, the control unit 200 stores the measured Vpp and power of the RF reflected wave in the ignition condition table in association with the antenna position and the adjusted RF voltage value, in step S410.

In the ignition condition table illustrated in FIG. 16, for example, when the antenna position is "1" and the reference RF voltage value is input in step S408, it is assumed that the plasma has not been ignited in step S409. Then, when the RF voltage value is changed to 301 V in step S408, it is assumed that the plasma has been ignited in step S409. In this case, in step S410, a Vpp value "78" and a power value "Pr23" of the RF reflected wave measured under ignition conditions including the input RF voltage value of 301 V are stored in the ignition condition table.

In this manner, after the ignition conditions are determined in the process S41 for searching for misfire conditions of the low pressure side, the ignition conditions are also determined again in the process S42 for searching for misfire conditions of the high pressure side.

In step S411, the control unit 200 increases the RF voltage value by 1 V from the current value. In step S412, the control unit 200 determines whether the plasma has misfired. When the control unit 200 determines that the plasma has not misfired, the control unit 200 returns to step S411 and further increases the RF voltage value by 1 V.

In step S412, the control unit 200 repeats the processes of steps S411 and S412 until the control unit 200 determines that the plasma has misfired. When the control unit 200 determines that the plasma has misfired in step S412, the control unit 200 stores the Vpp and the power of the RF reflected wave measured under the misfire conditions including the current RF voltage value in the misfire condition table in association with the antenna position and the current RF voltage value, in step S413.

In the misfire condition table of FIG. 17, for example, when the RF voltage value is set to 305 V in step S411, an upper limit value "100" of the measured Vpp, and an upper limit value of the power of the RF reflected wave (not illustrated), are stored in the misfire condition table in association with the antenna position "1". Although omitted in FIG. 17, an RF voltage value of "305V" when the plasma has misfired is also stored in association with the upper limit values of the measured Vpp and power of the RF reflected wave.

In steps S403, S406, S409, and S412, a method of determining ignition and misfire may be the same as that described in the first embodiment. In steps S405 and S411, the unit by which the RF voltage value is decreased or increased is not limited to increments of 1V. The unit by which the RF voltage value is decreased or increased may be preset by a user as a parameter value.

When the ignition condition calculation process in FIG. 15 is completed, the control unit 200 acquires ignition condition information from information stored in the ignition table, and stores the ignition condition information in the ignition table storage unit in association with the table number, in step S103 in FIG. 4. The control unit 200 may acquire a midpoint of the RF voltage values of ignition points, and store, in the ignition table storage unit, the Vpp and the voltage of the RF reflected wave when plasma ignition is performed under the ignition conditions of the midpoint. In the example of FIG. 16, when the RF voltage value of the ignition point has two points, 299 and 301, "74" indicating the Vpp and "Pr21" indicating the voltage of the RF reflected wave when ignition is performed at the RF voltage value of 300, which is the midpoint, may be stored in the ignition table storage unit in association with the RF voltage value of 300. The Vpp of 74, the RF power of Pr21, and the RF voltage value of 300 are examples of ignition condition information.

For example, an ignition table in FIG. 16 is named table 1 and stored in the ignition table storage unit. The ignition condition information may include the input ignition conditions (the gas type, the gas flow rate, and pressure), in addition to the antenna position, the RF voltage value, the Vpp, and the power of the RF reflected wave.

In step S104, the control unit 200 acquires misfire condition information from information stored in the misfire table, and stores the misfire condition information in the misfire table storage unit in association with the table number. For example, a misfire table in FIG. 17 is named table 1 and stored in the misfire table storage unit. The misfire condition information may include the input misfire conditions (the gas type, the gas flow rate, and pressure), in addition to the antenna position, the RF voltage value, the Vpp, and the power of the RF reflected wave.

In step S105, the control unit 200 performs a display process. The display process is as described in the first embodiment with reference to FIG. 9 and FIG. 10, and therefore will not be described herein.

As described above, according to the ignition condition calculation method according to the first and second embodiments, it is possible to calculate appropriate plasma ignition conditions. In the Paschen's law, a vertical axis represents a voltage, and a horizontal axis represents an integrated value of pressure and a distance between electrodes. Under conditions where the distance between electrodes is constant, when an RF voltage is fixed, at least one point of optimum ignition conditions may be determined by varying the pressure. Similarly, under conditions where the distance between electrodes is constant, when the pressure is fixed, at least one point of optimum ignition conditions may be determined by varying the RF voltage. Accordingly, it is possible to automatically calculate appropriate plasma ignition conditions.

In addition, it is possible to narrow down points of optimum ignition conditions even in a plasma ignition state from the Vpp or the voltage of the RF reflected wave measured under the ignition conditions and the upper and lower limit values of the voltage of the RF reflected wave and the upper and lower limit values of the Vpp measured under the misfire condition. As an example, it is possible to narrow down an ignition condition with the smallest difference between the upper and lower limit values of Vpp or an ignition condition with the smallest difference between the upper and lower limit values of the RF reflected wave as optimum ignition conditions. The voltage and Vpp of the RF reflected wave measured under the ignition conditions are an example of the first plasma state information. The upper and lower limit values of the voltage of the RF reflected wave and the upper and lower limit values of the Vpp measured under the misfire conditions are an example of the second plasma state information.

In addition, in the ignition condition calculation method according to the first and second embodiments, either the ignition condition calculation process of FIG. 5 or FIG. 15 may be used. In the ignition condition calculation methods according to the first and second embodiments, the ignition condition calculation process of FIG. 5 or FIG. 15 to be selectively executed may be automatically selected, or the pressure or RF voltage may be displayed on a screen to be selected by a user. When the user selects the fixing of the RF voltage, the ignition condition calculation process of FIG. 5 is performed, and when the user selects the fixing of the pressure, the ignition condition calculation process of FIG. 15 is performed.

The ignition condition calculation method and the plasma processing apparatus according to the embodiments disclosed herein should be considered to be illustrative in all respects and not restrictive.

The plasma processing apparatus disclosed in this specification is not limited to the plasma processing apparatus illustrated in the above embodiments. The plasma processing apparatus is not limited to a film forming apparatus, and may be applied to a plasma processing apparatus that performs a plasma processing such as an etching processing.

According to an aspect of the present disclosure, it is possible to calculate appropriate plasma ignition conditions.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An ignition condition calculation method comprising:
   (A) searching for ignition condition information including first plasma state information when a plasma is ignited under a preset ignition condition, and storing the ignition condition information in a storage;
   (B) searching for misfire condition information including second plasma state information when the plasma misfires after the plasma has been ignited, and storing the misfire condition information in the storage; and (C) displaying the ignition condition information and the misfire condition information on a display.

2. The ignition condition calculation method according to claim 1, wherein the preset ignition condition includes a gas type, a gas flow rate, and a pressure or a radio-frequency voltage.

3. The ignition condition calculation method according to claim 2, wherein, in (A), the gas type, the gas flow rate, and the radio-frequency voltage are input as the preset ignition condition; and
   in (B), an upper limit value and a lower limit value of the second plasma state information are searched by variably controlling a pressure within a processing container, and the misfire condition information including the upper limit value and the lower limit value of the second plasma state information is stored in the storage.

4. The ignition condition calculation method according to claim 2, wherein, in (A), the gas type, the gas flow rate, and the pressure are input as the preset ignition condition; and
   in (B), an upper limit value and a lower limit value of the second plasma state information are searched by variably controlling a radio-frequency voltage applied to an electrode of a plasma generation space, and the misfire condition information including the upper limit value and the lower limit value of the second plasma state information is stored in the storage.

5. The ignition condition calculation method according to claim 2, wherein the first plasma state information includes information of at least one of a peak-to-peak voltage difference when a radio-frequency voltage is applied, and radio-frequency power of a reflected wave for the radio-frequency voltage.

6. The ignition condition calculation method according to claim 1, wherein the preset ignition condition includes a gas type, a gas flow rate, an antenna position in a plasma generation space, and a pressure or a radio-frequency voltage.

7. The ignition condition calculation method according to claim 6, wherein, in (A), the gas type, the gas flow rate, the antenna position, and the radio-frequency voltage are input as the preset ignition condition; and
   in (B), an upper limit value and a lower limit value of the second plasma state information are searched by variably controlling a pressure within a processing container, and the misfire condition information including the upper limit value and the lower limit value of the second plasma state information is stored in the storage.

8. The ignition condition calculation method according to claim 6, wherein, in (A), the gas type, the gas flow rate, the antenna position, and the pressure are input as the preset ignition condition; and
   in (B), an upper limit value and a lower limit value of the second plasma state information are searched by variably controlling the radio-frequency voltage applied to an antenna of the plasma generation space, and the misfire condition information including the upper limit value and the lower limit value of the second plasma state information is stored in the storage.

9. The ignition condition calculation method according to claim 1, wherein, in (A), for each of a plurality of preset ignition conditions, a plurality of pieces of the ignition condition information is stored in the storage in association with the first plasma state information based on a result of the searching;

in (B), for each of the plurality of pieces of ignition condition information, a plurality of pieces of the misfire condition information is stored in the storage in association with the second plasma state information based on the result of the searching; and in (C), the plurality of pieces of the ignition condition information and the plurality of pieces of the misfire condition information are displayed on the display; and wherein the ignition condition calculation method further comprises:

(D) setting identification information of the ignition condition information and the misfire condition information selected from the plurality of pieces of the ignition condition information and the plurality of pieces of the misfire condition information, in a recipe including the preset ignition conditions.

10. The ignition condition calculation method according to claim 9, further comprising:

(E) outputting information on at least one of an ignition of the plasma or a misfire of the plasma based on the ignition condition information and the misfire condition information identified by the identification information set in the recipe when executing a process of the recipe.

11. A plasma processing apparatus comprising:

a processing container in which a plasma is generated; and a controller, wherein the controller is configured to control a process including:

(A) searching for ignition condition information including first plasma state information when the plasma is ignited under a preset ignition condition in the processing container, and storing the ignition condition information in a storage;

(B) searching for misfire condition information including second plasma state information when the plasma misfires after the plasma has been ignited in the processing container, and storing the misfire condition information in the storage; and (C) displaying the ignition condition information and the misfire condition information on a display.

* * * * *